(12) United States Patent
Sato et al.

(10) Patent No.: US 11,005,065 B2
(45) Date of Patent: May 11, 2021

(54) LAMINATE COMPRISING TANTALUM OXIDE AND METHOD OF PRODUCING THE SAME, GAS BARRIER FILM AND METHOD OF PRODUCING THE SAME, AND ORGANIC LIGHT-EMITTING ELEMENT

(71) Applicant: TOPPAN PRINTING CO., LTD., Tokyo (JP)

(72) Inventors: Jin Sato, Tokyo (JP); Mitsuru Kano, Tokyo (JP); Hiroshi Koyama, Tokyo (JP); Kyoko Kuroki, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 205 days.

(21) Appl. No.: 16/019,903

(22) Filed: Jun. 27, 2018

(65) Prior Publication Data

US 2018/0323401 A1 Nov. 8, 2018

Related U.S. Application Data

(63) Continuation of application No. PCT/JP2016/088851, filed on Dec. 27, 2016.

(30) Foreign Application Priority Data

| Dec. 28, 2015 | (JP) | JP2015-256602 |
| Dec. 28, 2015 | (JP) | JP2015-256826 |
| Jan. 5, 2016  | (JP) | JP2016-000438 |

(51) Int. Cl.
*B32B 9/04* (2006.01)
*H01L 51/52* (2006.01)
(Continued)

(52) U.S. Cl.
CPC ............. *H01L 51/5253* (2013.01); *B32B 9/00* (2013.01); *C23C 16/0272* (2013.01);
(Continued)

(58) Field of Classification Search
CPC ........ C23C 14/0676; B32B 9/04; B32B 9/041; B32B 9/045
See application file for complete search history.

(56) References Cited

U.S. PATENT DOCUMENTS

2005/0112874 A1 5/2005 Skarp et al.
2014/0376350 A1* 12/2014 Cheng .................. G11B 5/3136
369/13.33
(Continued)

FOREIGN PATENT DOCUMENTS

JP 2007-073332 A 3/2007
JP 2007-090803 A 4/2007
(Continued)

OTHER PUBLICATIONS

EP Office Action issued in the corresponding European Patent Application Ser. No. 16881757.5, dated Jul. 26, 2019.
(Continued)

*Primary Examiner* — Hoa (Holly) Le
(74) *Attorney, Agent, or Firm* — Foley & Lardner LLP

(57) ABSTRACT

A laminate includes: a substrate having a first surface and made of a high-molecular-weight material; an undercoat layer located on at least part of the first surface of the substrate and containing a first inorganic substance that has adsorption sites to be coupled to precursors serving as film-forming materials of an atomic layer deposition film; a functional layer located covering an outer surface of the undercoat layer and containing a second inorganic substance to be coupled to the adsorption sites of the undercoat layer,
(Continued)

the functional layer being the atomic layer deposition film formed of the precursors; and an overcoat layer located covering an outer surface of the functional layer and containing a third inorganic substance.

14 Claims, 5 Drawing Sheets

(51) Int. Cl.
| | |
|---|---|
| *H05B 33/04* | (2006.01) |
| *C23C 16/30* | (2006.01) |
| *H01L 51/50* | (2006.01) |
| *B32B 9/00* | (2006.01) |
| *H05B 33/02* | (2006.01) |
| *C23C 16/455* | (2006.01) |
| *C23C 16/02* | (2006.01) |
| *C23C 16/40* | (2006.01) |
| *C23C 16/56* | (2006.01) |
| *H01L 51/56* | (2006.01) |

(52) U.S. Cl.
CPC ............ *C23C 16/30* (2013.01); *C23C 16/403* (2013.01); *C23C 16/45525* (2013.01); *C23C 16/45555* (2013.01); *C23C 16/56* (2013.01); *H01L 51/50* (2013.01); *H01L 51/56* (2013.01); *H05B 33/02* (2013.01); *H05B 33/04* (2013.01); *H01L 2251/301* (2013.01); *H01L 2251/558* (2013.01)

(56) References Cited

U.S. PATENT DOCUMENTS

| | | | |
|---|---|---|---|
| 2015/0343741 A1* | 12/2015 | Shibata | ................. C23C 16/403 |
| | | | 428/336 |
| 2016/0009942 A1* | 1/2016 | Horiike | ................... B32B 27/06 |
| | | | 428/216 |
| 2017/0067151 A1 | 3/2017 | Nangou et al. | |

FOREIGN PATENT DOCUMENTS

| | | | |
|---|---|---|---|
| JP | 2007-516347 | A | 6/2007 |
| JP | 2011-241421 | A | 12/2011 |
| JP | 2012-116151 | A | 6/2012 |
| JP | 2013-232317 | A | 11/2013 |
| JP | 2014-148753 | A | 8/2014 |
| JP | 2014-151571 | A | 8/2014 |
| JP | 2015-003464 | A | 1/2015 |
| WO | WO-2004/105149 | A1 | 12/2004 |
| WO | WO-2013/015417 | A1 | 1/2013 |
| WO | WO-2014/092085 | A1 | 6/2014 |
| WO | WO-2014/156888 | A1 | 10/2014 |
| WO | WO-2015/133441 | A1 | 9/2015 |

OTHER PUBLICATIONS

International Search Report with English language translation and Written Opinion issued in International Application No. PCT/JP2016/088851 dated Apr. 11, 2017.
Office Action dated Sep. 30, 2020 for corresponding Chinese Patent Application No. 201680076055.8.

* cited by examiner

LAMINATE COMPRISING TANTALUM OXIDE AND METHOD OF PRODUCING THE SAME, GAS BARRIER FILM AND METHOD OF PRODUCING THE SAME, AND ORGANIC LIGHT-EMITTING ELEMENT

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/088851, filed on Dec. 27, 2016, which is based upon and claims the benefit of priority to Japan Priority Application No. 2015-256602, filed on Dec. 28, 2015; Japan Priority Application No. 2015-256826, filed on Dec. 28, 2015; Japan Priority Application No. 2016-000438, filed on Jan. 5, 2016; the disclosures of which are all hereby incorporated herein by reference in their entireties.

TECHNICAL FIELD

The present invention relates to a laminate and a method of producing the same, and a gas barrier film and a method of producing the same. For example, the present invention relates to a laminate including a substrate formed of a high-molecular-weight material and a method of producing the same, and a gas barrier film including the laminate and a method of producing the same. The present invention also relates to an organic light-emitting element including a gas barrier film, a first electrode layer, a light-emitting layer, and a second electrode layer. The present invention also relates to a laminate including an atomic layer deposition film and a method of producing the same.

BACKGROUND ART

Gas barrier performance is required of packages holding objects produced in the fields of foods, medicines, and the like. Gas barrier performance is imparted to a film by forming a thin film on the film substrate. Use of such gas barrier films can prevent the packaged objects from being deteriorated, e.g., oxidized, thanks to the moisture resistance and oxygen-blocking properties.

Gas barrier performance, including moisture resistance and oxygen-blocking properties, is also required in the fields related to electronic devices such as organic electroluminescent (EL) elements, liquid crystal display elements, solar cells, and the like. These electronic devices, which are required to have high gas barrier performance, conventionally use glass substrates. However, with the trend of electronic devices becoming thinner, lighter, and more flexible, attention has been drawn to films, as substitutes for glass substrates, having gas barrier performance that is equivalent to that of glass substrates.

Further, since long-term reliability is also required of electronic devices, gas barrier performance over a long period is further required of these devices in addition to the gas barrier performance in itself. However, films satisfying both high gas barrier performance and gas barrier performance over a long period are yet to be achieved.

Known methods for forming a thin film as a gas barrier film on the surface of an object include chemical vapor deposition (CVD) methods and physical vapor deposition (PVD) methods. In these methods, a gaseous phase is used to bring substances into a state of being able to move at the atomic or molecular level like gases.

A CVD method that uses plasma reaction is called PECVD (plasma enhanced CVD). A CVD method that uses a catalytic reaction is called Cat-CVD. In recent years, ALD (atomic layer deposition, hereinafter referred to as ALD) is drawing attention as a film forming method. ALD is a method of forming layers one by one at an atomic level by chemical reaction on a surface to which substances are adsorbed. ALD is classified into the CVD category.

Examples of PVD include vacuum deposition and sputtering. Since sputtering can form a thin film of high quality having good uniformity in quality and thickness, it is widely used for forming, for example, transparent electrode wiring films or electrode wiring films of display devices such as liquid crystal displays, and light reflection films of optical disks.

CVD is a method of growing a solid thin film. When forming a solid thin film using CVD, a raw material gas is introduced into a vacuum chamber, and one or more gases are decomposed or reacted with each other on the substrate with thermal energy. In this case, a plasma or catalyst reaction may be used in combination with decomposition or another reaction to promote the reaction or lower the reaction temperature during deposition.

Of the CVD methods, those which use plasma reactions are called PECVD (plasma enhanced CVD) and those which use catalytic reaction are called Cat-CVD. Since deposition defects are reduced when such a CVD method is used, this method is applied, for example, to the process of fabricating semiconductor devices (e.g., the process of forming gate insulating films) or other processes.

In commonly used CVD, gases are used singly or in combination for reaction on the substrate to grow a thin film. In contrast, ALD is a special deposition method of alternately using a highly active gas, which is also called precursor (termed first precursor hereinafter), and a reactive gas (also called a precursor in ALD, and accordingly termed a second precursor hereinafter). Alternately using these precursors, thin film layers are formed (grown) one by one at an atomic level through adsorption of the first precursor on the surface of the substrate, and the subsequent chemical reaction of the second precursor with the first precursor. Film formation by ALD is generally called two-dimensional growth. Examples of the first precursor include TMA (trimethylaluminum), and examples of the reactive gas include oxygen, carbon dioxide, water vapor (water), and the like.

Films are specifically formed through ALD as follows.

First, after adsorption of one layer of precursor on the substrate, the precursor that has not reacted is discharged, making use of the self-limiting effect. The self-limiting effect refers to a phenomenon where adsorption of a gas does not occur any more when the surface of the substrate is covered with the gas by surface adsorption.

Then, a reactive gas is introduced into the chamber, and the preceding precursor is oxidized or reduced to form one thin film having a desired composition. After that, the reactive gas is discharged.

In ALD, this cycle of the first and second steps is repeatedly performed to form thin films on the substrate.

Thus, in ALD, thin films grow two-dimensionally. In addition, ALD is characterized in that it causes fewer deposition defects as compared with conventional vacuum deposition, sputtering or other methods, and even as compared with the commonly used CVD.

Therefore, ALD is expected to be applied to various fields, including packaging such as for food, drug and electronics fields.

ALD may use plasma to activate the reaction in the step of decomposing the second precursor for reaction with the first precursor adsorbed on the substrate. This method is called plasma enhanced ALD (PEALD), or simply plasma ALD.

For example, PTL 1 discloses a gas barrier film having a plastic substrate which is alternately provided thereon with at least one barrier layer made of an inorganic material and at least one organic layer. According to the disclosure, at least one of the barrier layers in this gas barrier film is formed by ALD.

In contrast to ALD as described above, gas barrier films obtained by CVD or PVD being applied onto a film substrate for formation of a thin film having gas barrier performance cannot achieve gas barrier films having high gas barrier properties and that are usable as a substitute for a glass substrate.

For example, PTL 2 discloses that a sealing film having good gas barrier performance is applied to electronic devices such as an organic EL element. The sealing film is obtained by forming a protective layer made of a high-molecular-weight material on a barrier film. The barrier film is obtained by forming a thin film having gas barrier performance on a film substrate, using CVD, PVD, or other methods.

However, when a film formed using CVD or PVD is used as a thin film having gas barrier performance, the thin film is unlikely to have gas barrier performance required for electronic devices such as organic EL elements.

PTL 3 describes forming a barrier layer by modifying a layer containing a polysilazane.

With the configuration of PTL 3, although it is true that high gas barrier performance is imparted to the film, the barrier layer is not protected, and accordingly resistance to temperature or humidity, associated with long-term reliability of the electronic device is insufficient.

In recent years, flexible and lightweight barrier films are sought, for use in back sheets and front sheets of solar cells, organic EL elements, organic light-emitting elements, and the like. Further, regarding resistance to temperature or humidity, barrier films are required to have resistance not only to 85° C./85% RH of the conventional high temperature and high humidity test, but also to PCT (pressure cooker test; 105° C./100% RH) accelerated life test.

Usually, a gas barrier film has a metal or metal oxide film formed on at least one surface of the substrate and exerting gas barrier performance.

For example, a gas barrier film as described in PTL 1 has a metal or metal oxide film formed on at least one surface of the substrate and exerting barrier performance. However, when the substrate is a polymer film, it has larger asperities on the surface and includes nano-level spaces such as free volumes, as compared with a silicon wafer or a photomask used in the field of semiconductors. Thus, it is difficult to achieve stable formation of metal or metal oxide (to maintain the film quality or adhesion).

Therefore, when a product including a gas barrier film, which uses a polymer film as the substrate, is exposed to environmental stress such as high temperature, high humidity, etc., the metal-containing film may deteriorate, or the adhesion between the substrate and the metal-containing film may be lowered. Resultantly, the laminate may not necessarily maintain desired gas barrier performance.

Under such circumstances, PTL 4, for example, discloses a technique of forming a first inorganic material by sputtering on a substrate formed of a plastic film and a primer layer formed of an ultraviolet curable resin having a smoother surface than the plastic film. PTL 4 also describes further providing a barrier layer by ALD on the barrier layer formed by sputtering.

PTL 5 discloses a technique of improving preservation stability under high temperature and high humidity conditions by forming a second gas barrier layer by ALD on a first gas barrier layer containing a polysilazane compound formed on a substrate.

PTL 6 discloses a product including a substrate made of a material selected from the group consisting of plastic and a glass, and a gas permeable barrier deposited on the substrate by ALD.

Further, PTL 6 also discloses that a light-emitting polymer is mounted on a plastic substrate having optical transparency and atomic layers are vapor-deposited on the top and side surfaces of the light-emitting polymer by means of ALD (top coating), thereby reducing coating deficiencies and drastically lowering gas permeability for the thickness of several tens of nanometers.

When an atomic layer deposition film is formed by ALD on a substrate made of an organic polymer, the form of growth of the atomic layer deposition film differs from that when forming an atomic layer deposition film on a substrate made of an inorganic crystal such as a Si wafer.

When a Si wafer having an oxidation treated surface is used as a substrate and an atomic layer deposition film is formed on the substrate by ALD, growth of the atomic layer deposition film proceeds in a two-dimensional growth mode. This is because adsorption sites for precursors, which will serve as materials of the atomic layer deposition film, are present on the surface of the substrate with high density.

However, when an atomic layer deposition film is formed by ALD on a substrate made of an organic polymer, the adsorption sites of the precursors as materials of the atomic layer deposition film are present on the surface of the substrate with a low density. Thus, it is known that the atomic layer deposition film grows and expands three-dimensionally on the surface of the substrate, with the precursors adsorbed in an isolated manner to serve as nuclei, and that, resultantly, adjacent nuclei contact with each other to turn the atomic layer deposition film into a continuous film.

Depending on the state of the substrate made of an organic polymer and the process condition of ALD, there is a high probability that the atomic layer deposition film does not produce a continuous layer.

That is, when an atomic layer deposition film is formed on the substrate made of an organic polymer by ALD, there is a risk that gas may pass through the outer surface of the atomic layer deposition film and a plurality of gaps constituting the atomic layer deposition film toward the substrate, or vice versa.

That is, when an atomic layer deposition film is formed on a substrate made of an organic polymer by ALD, there is a risk that the atomic layer deposition film does not have desired gas barrier properties.

A technique for solving the above issue is disclosed in PTL 7.

PTL 7 discloses forming a primer layer made of an inorganic material on a substrate made of an organic polymer (on an outer surface of a substrate), and forming an atomic layer deposition film on the surface of the primer layer.

CITATION LIST

Patent Literature

[PTL 1] JP 2007-090803 A; [PTL 2] JP 2007-73332 A; [PTL 3] JP 2013-232317 A; [PTL 4] JP 2012-116151 A; [PTL 5] JP 2014-151571 A; [PTL 6] JP 2007-516347 A; [PTL 7] JP 2011-241421 A;

SUMMARY OF THE INVENTION

Technical Problem

However, according to the technique disclosed in PTL 4, since a polymer material is used for the primer layer and the barrier film is formed by sputtering, high gas barrier performance cannot be achieved. According to the configuration described in PTL 4 in which a barrier layer formed by ALD is provided on the outermost surface, the atomic layer deposition film that exhibits gas barrier performance suffers from deterioration and damage because of being exposed to a high temperature and high humidity environment or being applied with mechanical stress, making it difficult to secure reliability.

In the technique disclosed in PTL 5, vacuum-ultraviolet light is irradiated to a polysilazane compound, or a hydrolysis reaction is caused in the polysilazane compound to form the inorganic polymer as a primer layer, and then an atomic layer deposition film is formed on the primer layer. However, since the atomic layer deposition film is formed on the polymer layer, gas barrier performance is slow to be exhibited and also it is difficult to ensure reliability. Further, since the atomic layer deposition film is located at the outermost layer, the atomic layer deposition film exhibiting gas barrier performance suffers from deterioration and damage because of being directly exposed to a high temperature and high humidity environment or being applied with mechanical stress, making it difficult to secure reliability.

Thus, to ensure the performance of the laminate and to reduce or prevent deterioration in the properties of the laminate, it may be necessary to form an undercoat layer, on which the functional layer is formed, so as to have a surface having fewer or no free volumes, unlike the surface of a polymer film where free volume spaces are present.

As described above, a laminate provided to a functional layer on the outer surface of the organic polymer substrate by physical or chemical vapor deposition has been widely known. Such laminates are suitably used as flexible films exhibiting performance such as of gas barrier films having gas barrier properties.

When a functional layer of an atomic layer deposition film is formed on a substrate made of an organic polymer by physical or chemical vapor deposition as stated above, two-dimensional growth of the atomic layer deposition film is retarded due to the presence of the free volume spaces, and exertion of the gas barrier performance is retarded accordingly. Further, since the film is not formed densely, chemical stability is also impaired. Resultantly, it is difficult to sufficiently secure the reliability of the functional layer, and thus the properties of the functional layer are not necessarily maintained.

Furthermore, in the absence of an overcoat layer for protecting the outer surface of the functional layer, the functional layer may be deteriorated or the properties of the functional layer may be lowered, making it difficult to ensure the gas barrier performance of the laminate. Therefore, when forming an organic light-emitting element, if the element is formed directly on the functional layer, the functional layer may be deteriorated due to the stress caused in the element formation process, and protection performance of the element against gas such as water vapor and oxygen may be lost, creating spots (dark spots) where the organic light-emitting element is disabled from displaying an image (emitting light).

The inventors of the present invention studied the technique disclosed in PTL 7. As a result of the study, it was found that an atomic layer deposition film having high gas barrier properties can be obtained by forming a primer layer made of an inorganic material, but there was variance in the degree of the properties.

Regarding the above, the inventors of the present invention studied the relationship between the gas barrier properties and the primer layer. As a result of the study, the reason why sufficient gas barrier properties could not be obtained was presumed to be as follows. Specifically, it was presumed that, since the primer layer made of an inorganic material had pores and the pore diameter was large, the precursors which should have been coupled to the functional groups (adsorption sites) on the surface of the primer layer were spread into the primer layer, and prevented start of sufficient two-dimensional growth of the atomic layer deposition film for filling the pores.

In particular, sufficient gas barrier properties are not obtained when the atomic layer deposition film is thin.

The present invention has been made in view of the circumstances stated above, and has an object of providing a laminate with improved reliability, including a substrate formed of a high-molecular-weight material and a functional layer having an atomic layer deposition film formed on the substrate, and a method of producing the same.

Another object of the present invention is to provide a gas barrier film capable of improving reliability and gas barrier properties, and a method of producing the same.

Another object of the present invention is to provide an organic light-emitting element with a gas barrier film, which reduces or prevents deterioration of or damage to the functional layer formed of an atomic layer deposition film, and improves and ensures barrier performance and long-term reliability of the functional layer.

Further, the present invention has been made in view of the circumstances stated above, and has an object of providing a laminate formed on an organic polymer substrate and including a primer layer made of an inorganic material, in which the maximum pore diameter is small, which is capable of enhancing gas barrier properties of an atomic layer deposition film, and a method of producing the same.

Solution to Problem

A laminate according to a first aspect of the present invention includes: a substrate having a first surface and made of a high-molecular-weight material; an undercoat layer located on at least part of the first surface of the substrate and containing a first inorganic substance that has adsorption sites to be coupled to precursors serving as film-forming materials of an atomic layer deposition film; a functional layer located covering an outer surface of the undercoat layer and containing a second inorganic substance to be coupled to the adsorption sites of the undercoat layer, the functional layer being the atomic layer deposition film formed of the precursors; and an overcoat layer located covering an outer surface of the functional layer and containing a third inorganic substance.

In the first aspect, the undercoat layer and the overcoat layer may be inorganic layers containing at least one element from among group III elements, group IV elements, group V elements, and lanthanoid elements.

In the first aspect, the undercoat layer and the overcoat layer may contain at least one of an oxide, a nitride, and an oxynitride.

In the first aspect, the undercoat layer and the overcoat layer may contain tantalum (Ta).

In the first aspect, the undercoat layer may have a thickness in a range of 1 nm or more to 200 nm or less.

In the first aspect, the functional layer may have a thickness in a range of 0.5 nm or more to 200 nm or less.

In the first aspect, the overcoat layer may have a thickness in a range of 5 nm or more to 200 nm or less.

In the first aspect, the adsorption sites located on the outer surface of the undercoat layer may have oxygen (O) atoms or nitrogen (N) atoms.

A gas barrier film according to a second aspect of the present invention includes the laminate according to the first aspect, wherein the laminate has a water vapor transmission rate of 0.5 g/(m² day) or less.

An organic electroluminescent device according to a third aspect of the present invention includes the laminate according to the first aspect, a first electrode layer, a light-emitting layer, and a second electrode layer.

In the third aspect, the laminate may have a water vapor transmission rate of 0.01 g/(m² day) or less.

A method of producing a laminate according a fourth aspect of the present invention includes: placing a substrate made of a high-molecular-weight material in a vacuum chamber; forming an undercoat layer containing a first inorganic substance that has adsorption sites to be coupled to precursors serving as materials for forming an atomic layer deposition film, on at least part of an outer surface of the substrate; forming a functional layer from the precursors by atomic layer deposition to cover an outer surface of the undercoat layer, the functional layer containing a second inorganic substance coupled to the adsorption sites; and forming an overcoat layer containing a third inorganic substance to cover an outer surface of the functional layer.

The method of producing a laminate according to the fourth aspect may include a first step of supplying the precursors so as to be coupled to the adsorption sites on the outer surface of the undercoat layer, when forming the functional layer; a second step, following the first step, of discharging the precursors not coupled to the adsorption sites, from the vacuum chamber; a third step of repeating the first step and the second step a predetermined number of times; a fourth step, following the third step, of supplying a reaction gas into the vacuum chamber and applying a voltage to the reaction gas to generate plasma for reaction of the plasma with the precursor so that an atomic layer deposition film with a thickness of one atomic layer is formed; and performing, following the fourth step, a cycle of the first to fourth steps 15 times or more so that the laminated atomic layer deposition film has a total thickness corresponding to a thickness predetermined for the functional layer.

In the method of producing a laminate according to the fourth aspect, the undercoat layer and the overcoat layer may be formed by chemical vapor deposition or physical vapor deposition.

In the method of producing a laminate according to the fourth aspect, the undercoat layer and the overcoat layer may be inorganic layers containing at least one element from among group III elements, group IV elements, group V elements, and lanthanoid elements.

In the method of producing a laminate according to the fourth aspect, the undercoat layer may be so formed as to have a thickness in a range of 1 nm or more to 20 nm or less.

In the method of producing a laminate according to the fourth aspect, the functional layer may be so formed as to have a thickness in a range of 1 nm or more to 200 nm or less.

In the method of producing a laminate according to the fourth aspect, the overcoat layer may be so formed as to have a thickness in a range of 5 nm or more to 200 nm or less.

A method of producing a gas barrier film according to a fifth aspect of the present invention includes forming the laminate through the method of producing a laminate according to the fifth aspect so as to have a water vapor transmission rate of 0.5 g/(m² day) or less.

A method of producing a laminate according to a sixth aspect of the present invention includes: forming a primer layer including pores with a maximum diameter of 1.0 nm or less using an inorganic material, on at least part of an outer surface of a substrate made of an organic polymer and placed in a vacuum chamber; and forming an atomic layer deposition film by supplying precursors serving as film-forming materials to an outer surface of the primer layer to allow the precursors to react with a reaction gas on at least part of the outer surface of the primer layer.

Advantageous Effects of the Invention

According to the laminate and the method of producing the laminate according to each of the above aspects of the present invention, an undercoat layer is formed on a substrate made of a high-molecular-weight material. Thus, an atomic layer deposition film is densely formed on the undercoat layer. Furthermore, a functional layer formed of the atomic layer deposition film is covered with an overcoat layer. Therefore, reliability is improved in the laminate including the substrate made of a high-molecular-weight material and a functional layer including the atomic layer deposition film formed on the substrate.

The gas barrier film and the method of producing the gas barrier according to each of the aspects of the present invention use the laminate and the method of producing the laminate of the present invention. Thus, there is provided an advantageous effect of improving reliability and gas barrier properties of the gas barrier film.

DESCRIPTION OF THE REPRESENTATIVE EMBODIMENTS

With reference to the drawings, some embodiments of the present invention will be described. Throughout the drawings, the same reference signs are given to the same or corresponding components between different embodiments to omit duplicate description. It will be understood the following embodiments are intended to be representative of the present invention. The present invention is not necessarily limited to the embodiments described herein.

First Embodiment

A laminate according to an embodiment of the present invention will be described.

Figure 1:
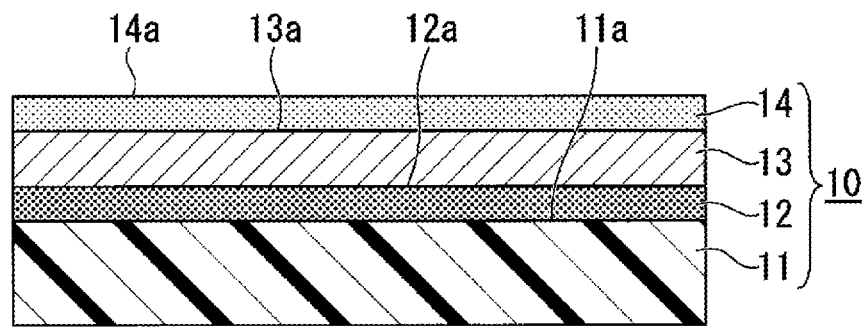
FIG. 1 is a schematic cross-sectional view illustrating an example of a configuration of a laminate according to a first embodiment of the present invention.

FIG. 1 is a schematic cross-sectional view illustrating an example of a configuration of the laminate according to the first embodiment of the present invention.

Since FIG. 1 is a schematic view, the sizes, thicknesses, dimensions, and the like of the components shown do not precisely represent the actual dimensional relationship in the laminate (the same applies to the following drawings).

As shown in FIG. 1, a laminate (gas barrier film) 10 of the present embodiment includes a substrate 11, an undercoat layer 12 (inorganic layer), a functional layer 13, and an overcoat layer 14 (inorganic layer).

The substrate 11 is formed of a high-molecular-weight material. The substrate 11 has an outer surface 11a (first surface) as a surface in the thickness direction, on which the undercoat layer 12 described later is formed.

The choice of the high-molecular-weight material forming the substrate 11 is not particularly limited. The substrate 11 may be in the form of a plate not having flexibility or in the form of a film having flexibility.

When the laminate 10 is used as a gas barrier film, a substrate in the form of a film (termed film-like substrate hereinafter) is preferably used as the substrate 11. In this case, the thickness of the substrate 11 (film-like substrate) is preferably in the range, for example, of 12 µm or more to 300 µm or less, more preferably in the range of 12 µm or more to 100 µm or less.

If the thickness of the substrate 11 is less than 12 µm, its ease of handling may be impaired, and breakage, wrinkles, or the like are likely to occur. If the thickness of the substrate 11 exceeds 300 µm, the amount of the material forming the substrate 11 increases and thus the cost increases.

Examples of the high-molecular-weight material as the material of the substrate 11 include polyethylene terephthalate (PET), polyether sulfone (PES), polyimide (PI), and the like.

The undercoat layer 12 is an inorganic layer formed on the outer surface 11a of the substrate 11 to laminate the functional layer 13 described later thereon. The inorganic substance of the undercoat layer 12 contains a first inorganic substance. The first inorganic substance has adsorption sites which are easily coupled to precursors serving as the film-forming materials used for forming an atomic layer deposition film 24 that constitutes the functional layer 13 described later.

Each adsorption site of the first inorganic substance may have a chemical structure of containing atoms each having an unshared electron pairs or unpaired electrons, and of achieving an interaction with precursors, described later, such as coordinate bonding, bonding due to intermolecular force (van der Waals force), or hydrogen bonding.

Accordingly, the undercoat layer 12 containing the first inorganic substance has the adsorption sites on its outer surface 12a, which is on the opposite side of the outer surface 11a of the substrate 11 in the thickness direction, to chemically adsorb the precursors constituting the material for forming the atomic layer deposition film.

The first inorganic substance used for the undercoat layer 12 is not particularly limited as long as it has a surface where atoms or functional groups can chemically adsorb the precursors constituting the material for forming the atomic layer deposition film 24 described later. Examples of the atoms or functional groups capable of chemically adsorbing the precursors include oxygen (O) atoms, nitrogen (N) atoms, and other atoms and functional groups which exhibit nucleophilic properties.

The first inorganic substance contained in the undercoat layer 12 may contain at least one element from among, for example, group III elements, group IV elements, group V elements, and lanthanoid elements.

The first inorganic substance may be a metal oxide, metal nitride, metal sulfide, or metal oxynitride. The first inorganic substance may be a film of a mixture of these compounds or a ternary or higher compound containing a plurality of metal elements.

The first inorganic substance may contain a Group II element or a transition metal element. The first inorganic substance may have a surface including adsorption sites, such as OH groups, capable of chemically adsorbing the precursors constituting the material for forming the atomic layer deposition film. The main component of the undercoat layer 12 may be a metal film.

Examples of the metal oxide that can be used as the first inorganic substance include $TaO_x$, $SiO_x$, $TiO_x$, $HfO_x$, $NbO_x$, $ZrO_x$, $AlO_x$, and the like.

Examples of the metal nitride include $SiN_y$, $TiN_y$, $AlN_y$, and the like.

Examples of the ternary oxide include $AlSi_xO_y$, and the like.

For example, the first inorganic substance may be a composition, such as $BaTiO_3$ or $SrTiO_3$, used as a material for the gate insulating films or memory elements which are used for semiconductor devices, or a composition generally used as a material less likely to leak current.

The undercoat layer 12 can be formed on the substrate 11 by, for example, chemical vapor deposition (CVD) or physical vapor deposition (PVD). The undercoat layer 12 may be formed through a sol-gel method.

The undercoat layer 12 formed through CVD, PVD, or a sol-gel method will have a dense and smooth layer portion if the substrate includes free volume spaces in the surface, as does the substrate 11 made of a high-molecular-weight material.

The undercoat layer 12 may have a thickness, for example, in the range of 1 nm or more to 1,000 nm or less.

If the thickness of the undercoat layer 12 is less than 1 nm, the growth of the undercoat layer 12 tends to remain at the island growth stage and may no longer grow as a film. If the growth of the undercoat layer 12 remains at the island stage, there is no forming of a primer where the atomic layer deposition film, described later, can grow two-dimensionally from early on.

If the thickness of the undercoat layer 12 exceeds 1,000 nm, too much time is taken for deposition, increasing cost. If the undercoat layer 12 receives stress, such as bending, or thermal expansion, from the substrate 11, defects, such as cracks, may be likely to occur.

It is more preferable that the thickness of the undercoat layer 12 is in the range of 1 nm or more to 200 nm or less.

If the thickness of the undercoat layer 12 is 1 nm or more, free volumes, described later, in the outer surface 11a of the substrate 11 can be more reliably covered. Accordingly, a primer is likely to be easily formed for two-dimensional growth of the atomic layer deposition film, and the resultant atomic layer deposition film will have better gas barrier performance described later.

In addition, the undercoat layer 12 in itself will have a higher strength and better gas barrier properties. Therefore, the gas barrier performance as the laminate 10 can be improved.

If the thickness of the undercoat layer 12 is 200 nm or less, the time or cost required for forming the undercoat layer 12 can be reduced. In other words, if the thickness of the undercoat layer 12 is in the range of 3 nm or more to 200 nm or less, the undercoat layer 12 can be formed at low cost and in a short time, while the primer is ensured to be established for earlier two-dimensional growth of the atomic layer deposition film, as described later.

FIG. 1 shows, as an example, the case where the undercoat layer 12 is provided covering the overall outer surface 11a of the substrate 11. However, the undercoat layer 12 is not limited to the structure shown in FIG. 1, but it may only have to be provided on the outer surface 11a of the substrate 11, over the area where the functional layer 13 described later is formed.

The functional layer 13 is provided covering the outer surface 12a of the undercoat layer 12. The functional layer 13 has an outer surface 13a which is on the opposite side of the outer surface 12a of the undercoat layer 12. In the functional layer 13, the adsorption sites on the outer surface 12a of the undercoat layer 12 are coupled to the precursors serving as the film-forming materials. That is, the functional layer 13 corresponds to the atomic layer deposition film 24 formed by atomic layer deposition (ALD).

For example, the precursors used for forming the atomic layer deposition film 24 may be an organometallic compound.

The organometallic compound used for the precursors may, for example, be tri-methyl aluminum (TMA), titanium tetrachloride ($TiCl_4$), trisdimethylaminosilane (3DMAS), bisdiethylaminosilane (BDEAS), pentakis(dimethylamino) tantalum (PDMAT), or the like.

The functional layer 13 contains a second inorganic substance and is formed using the above-described precursors as the material. The second inorganic substance is coupled to the adsorption sites on the outer surface 12a of the undercoat layer 12.

The second inorganic substance may contain at least one element from among, for example, group III elements, group IV elements, group V elements, and lanthanoid elements.

Forming an atomic layer deposition film made of inorganic substances containing, as the second inorganic substance, at least one element from among group III elements, group IV elements, group V elements, and lanthanoid elements, higher gas barrier performance can be obtained as compared with other deposition methods.

The elements contained in the second inorganic substance are not limited to the elements mentioned above as long as gas barrier performance can be exerted. For example, the second inorganic substance may contain any element, such as a transition element or a typical element, as long as the composition enables formation of a layer on the substrate.

The second inorganic substance may, for example, be an oxide such as $TaO_x$, $SiO_x$, $TiO_x$, $AlO_x$, $HfO_x$, $NbO_x$, $ZrO_x$ or the like. Further, the second inorganic substance may be an oxide, such as $AlSi_xO_y$ or $TiAl_xO_y$, obtained by mixing two or more of these substances.

Examples of the composition of the inorganic oxide include $SiO_x$ ($1 \leq x \leq 2$), $AlO_x$ (where $1 \leq x \leq 1.5$), and $TiO_x$ (where $1.5 \leq X \leq 2$).

For example, the composition of the functional layer 13 may be one, such as $BaTiO_3$, $SrTiO_3$, or $Ta_2O_5$, used as a material for the gate insulating films or memory elements which are used in the field of semiconductor devices, a composition generally used as a material less likely to leak current.

The functional layer 13 may have a thickness, for example, in the range of 0.5 nm or more to 200 nm or less.

For example, if the thickness of the functional layer 13 is less than 0.5 nm, performance such as of gas barrier properties is not necessarily exhibited.

If the thickness of the functional layer 13 exceeds 200 nm, too much time and cost may be required for forming the functional layer 13, and in addition, cracks and the like are likely to occur due to the internal stress of the film.

With the thickness in the range of 0.5 nm or more to 200 nm or less, functional layers 13 having good gas barrier properties can be produced at low cost.

The overcoat layer 14 is provided covering the outer surface 13a of the functional layer 13.

Covering the outer surface 13a of the functional layer 13, the overcoat layer 14 can protect the functional layer 13 from environmental stress, particularly from a high temperature and high humidity environment.

Since the overcoat layer 14 is formed covering the functional layer 13 and the undercoat layer 12, the functional layer 13 and the undercoat layer 12 can be protected from mechanical stress.

The overcoat layer 14 is configured to contain a third inorganic substance.

The third inorganic substance is a material having environmental stress resistance and mechanical stress resistance that are equivalent to or higher than those of the second inorganic substance contained in the functional layer 13.

The third inorganic substance may, for example, be any of the inorganic substances mentioned as the first inorganic substance. The third inorganic substance used for the overcoat layer 14 may be the same as or different from the first inorganic substance used for the undercoat layer 12. The composition of the entire overcoat layer 14 may be the same as or different from the composition of the entire undercoat layer 12.

The overcoat layer 14 can be formed by chemical or physical vapor deposition as with the undercoat layer 12.

Use of the third inorganic substance for the overcoat layer 14 can reduce or prevent deterioration of the gas barrier performance of the undercoat layer 12 and the functional layer 13 due to environmental stress.

Further, formation of the overcoat layer 14, which is the third inorganic substance, on the functional layer 13 can further improve the gas barrier performance of the laminate 10.

The overcoat layer 14 may have a thickness that can protect the undercoat layer 12 and the functional layer 13 from environmental stress or mechanical stress. Such a thickness may be determined according to the use environment of the laminate 10 and the like, and according to the environmental stress resistance or the mechanical stress resistance characteristic of the third inorganic substance.

For example, in the case where the third inorganic substance is a metal oxide, a metal nitride, or a metal oxynitride as mentioned above, the thickness may be determined as appropriate within the range of 3 nm or more to 2000 nm or less.

If the thickness of the overcoat layer 14 is less than 3 nm, the protection performance against environmental stress may be impaired.

If the thickness of the overcoat layer 14 exceeds 2,000 nm, defects such as cracks may occur when the overcoat layer 14 receives stress, such as bending, or thermal expansion, from the substrate 11.

More preferably, the thickness of the overcoat layer 14 is in the range, for example, of 5 nm or more to 300 nm or less.

With the thickness of 5 nm or more, the overcoat layer will exert even better effect of protection against environmental stress. If the thickness of the overcoat layer is 300 nm or less, cracks and the like due to bending of the film or thermal expansion of the film are less likely to occur. The effect of protection against mechanical stress becomes even better if the thickness is about 200 nm or more.

The following description addresses a method of producing the laminate of the present embodiment.

Figure 2A:
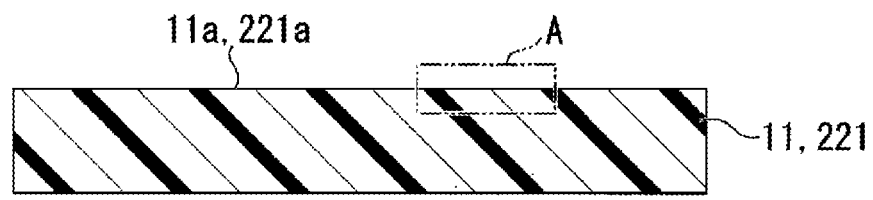
FIG. 2A is a schematic cross-sectional view illustrating a substrate used for the laminate according to the first embodiment, and for a gas barrier film according to a second embodiment of the present invention.
Figure 2B:
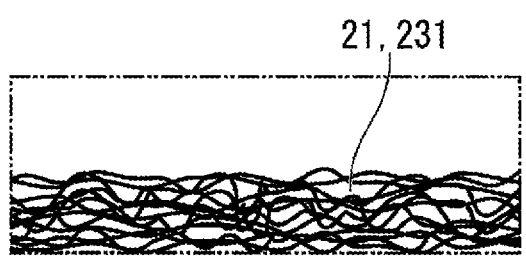
FIG. 2B is an enlarged view of the part A of FIG. 2A.
Figure 3A:
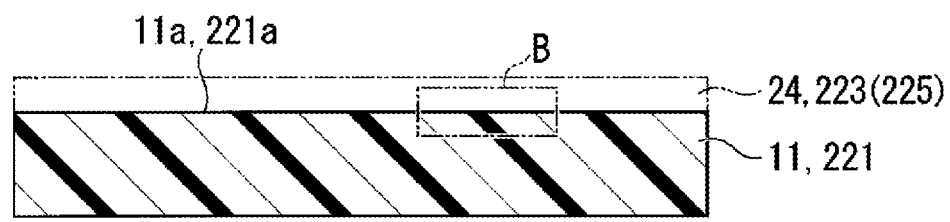
FIG. 3A is a schematic cross-sectional view illustrating a first layer that is an atomic deposition film, when forming a functional layer without an intervening undercoat layer on the substrate.
Figure 3B:
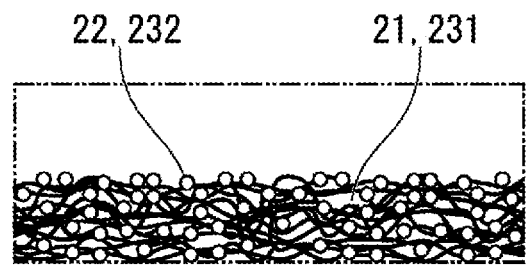
FIG. 3B is an enlarged view of the part B of FIG. 3A.

FIG. 2A is a schematic cross-sectional view of a substrate used for the laminate of the present embodiment. FIG. 2B is an enlarged view of the part A of FIG. 2A. FIG. 3A is a schematic cross-sectional view illustrating a first layer that is the atomic deposition film in the case where the functional layer is formed without an intervening undercoat layer on the substrate. FIG. 3B is an enlarged view of the part B of FIG. 3A.

First, the principle of the present producing method will be described.

Laminates having an atomic layer deposition film formed by ALD are currently used for organic thin film EL, displays, semiconductor memories (DRAM (dynamic random access memory)), and substrates, such as glass substrates or silicon substrates, for electronic components.

However, the fact is that only a small advancement is being made in research on ALD that is suitable for substrates which are made of high-molecular-weight materials as is the substrate 11 of the laminate 10.

It is generally considered that when an atomic layer deposition film is formed on a substrate for an electronic component, the atomic layer deposition film grows two-dimensionally. On the other hand, when an atomic layer deposition film is formed on an organic polymer substrate (e.g., PET), which is a high-molecular-weight material, it is highly likely that the atomic layer deposition film does not grow two-dimensionally in the initial growth stage, for example, at the state of a thin film of about 1.0 nm.

That is, it is considered that in the initial growth stage of an atomic layer deposition film using ALD on the outer surface of the substrate of a high-molecular-weight material, the primary two-dimensional growth derived from ALD cannot be achieved and exertion of the barrier performance is retarded.

The main reasons for this are considered to reside in the density of adsorption sites, and diffusion of the precursors into the free volume regions in the outer surface of the substrate. The inventors predicted that an atomic layer deposition film could be efficiently formed by forming a surface similar to that of a glass substrate, a silicon substrate, or the like.

Through various studies and experiments, the inventors have found that when an undercoat layer made of an inorganic material is formed on a substrate, the atomic layer deposition film grows two-dimensionally at an earlier stage, and the gas barrier performance improves and, further, the durability to environmental stress improves. That is, it has been found that, when an inorganic substance is used for the surface on which the atomic layer deposition film grows, the growth differs from that in the case where the atomic layer deposition film is formed directly on the surface of a high-molecular-weight material.

When a substrate, such as a glass or silicon substrate, having a smooth surface (outer surface) with no free volume spaces is used for formation of an atomic layer deposition film thereon, the precursors serving as the material of the atomic layer deposition film are coupled to adsorption sites on the outer surface (surface) and grow.

Substrates made of a high-molecular-weight material include crystalline regions (crystalline parts) and amorphous regions (amorphous parts). There are voids called free volumes in these amorphous regions. For example, when water vapor transmission rate is measured for such a substrate, water molecules pass through the voids and permeate the substrate.

It has been confirmed that the precursors (film-forming material) in the atomic layer deposition film diffuse into the substrate to some depth, if they have a smaller molecular size than the voids in the free volumes, i.e., the molecular size similar to water molecules.

The inventors of the present invention have found that lamination of one inorganic material layer on the upper surface of an atomic layer deposition film can reduce or prevent deterioration of gas barrier performance, under the conditions of the atomic layer deposition film being exposed to environmental stress, such as high temperature and high humidity.

Further, formation of one inorganic material layer on the upper surface of the atomic layer deposition film can increase resistance to mechanical stress, such as rubbing or pressing, directly applied to the atomic layer deposition film. Thus, formation of such a layer can reduce or prevent deterioration of gas barrier performance, which would otherwise be more significant when mechanical stress is applied to the laminate.

The inventors of the present invention studied the relationship of environmental stress or mechanical stress to the water vapor transmission rate, using a laminate in which an undercoat layer containing an inorganic substance considered to have no free volumes is formed between the substrate and the functional layer, and an overcoat layer containing an inorganic substance is formed as a protective layer so as to cover the upper surface of the functional layer. As a result of the studies, the inventors have reached the present invention.

Adsorption sites are necessary for the precursors, i.e., material of the atomic layer deposition film, to adsorb to the surface of the undercoat layer and react. The adsorption sites may each have a chemical structure surface, for example, having O atoms or OH groups, or having N atoms or $NH_x$ groups.

For example, a substrate made of a high-molecular-weight material has OH groups, COOH groups, COR groups, or $NH_x$ groups which can chemically adsorb the precursors, as does PET, PEN (polyethylene terephthalate), PI, or the like. However, since the high-molecular-weight material has a surface including free volumes into which the precursors unavoidably penetrate, two-dimensional growth of the atomic layer deposition film is considered to be hindered.

As shown in FIGS. 2A and 2B, voids 21 in the free volumes are present at the outer surface 11a of the substrate 11 before forming the laminate 10.

As shown in FIGS. 3A and 3B, an atomic layer deposition film 24 is directly formed on the outer surface 11a of this substrate 11. The void 21 in each of the free volumes in the outer surface 11a is larger than the molecular size of each of precursors 22 serving as the material for forming the atomic layer deposition film 24. Thus, the precursors 22 diffuse into the free volumes and are chemically adsorbed to the surface, whereby three-dimensional growth of an atomic layer deposition film 24 occurs.

That is, the precursors 22 are three-dimensionally adsorbed to the adsorption sites in the voids 21, and located being isolated from each other. When the adsorption sites are located being isolated from each other, the growth of the atomic layer deposition film will be three-dimensional with the adsorption sites acting as nuclei.

That is, in the presence of the free volumes, the precursors, while causing the atomic layer deposition film to spread three-dimensionally, are sparsely adsorbed to the sites such as of OH groups. Thus, the atomic layer deposition film unevenly grows, forming columns centering on the respective isolated nuclei, and preventing efficient formation of the atomic layer deposition film. Accordingly, it is difficult to form an ideal functional layer at the initial growth stage.

Therefore, to form a two-dimensionally grown dense film of atomic layer characteristic of ALD, a film thickness of some degree is required to be reached until the three-dimensional asperities at the initial growth stage are filled.

Thus, when the film thickness is small, it means that the growth has remained at the initial stage and accordingly the denseness of the film has not been secured. As a result, the initial gas barrier performance may deteriorate or the reliability of the gas barrier performance may be impaired.

To solve these issues, it is necessary to continue film formation until a dense atomic deposition film is formed, and thus a long period of time is taken for producing the film.

On the other hand, inorganic materials, such as $TaO_x$, $SiO_x$, $TiO_x$, $AlO_x$, $SiN_y$, and $TiN_y$, have O atoms or N atoms on the surface and do not have free volumes. Therefore, two-dimensional growth of an atomic layer deposition film is prevented from being retarded due to permeation of the precursors. Further, by surface-treating the inorganic substance with plasma or the like, adsorption sites such as OH groups can be introduced.

The chemical adsorption of the precursors of the atomic layer deposition film to the adsorption sites is considered to occur as follows. That is, metal-containing precursors, such as gaseous precursors (e.g., TMA: tri-methyl aluminum) or $TiCl_4$, are chemically adsorbed to the outer surface (front surface) of the undercoat layer made of an inorganic material. This is the first step of ALD. In this case, the presence of the adsorption sites greatly affects the chemical adsorption of the precursors, i.e., the two-dimensional growth of the atomic layer deposition film.

For example, if the surface on which the atomic layer deposition film is formed is a metal oxide ($MO_x$, or the surface is M-OH), the precursors of the atomic layer deposition film are reversibly adsorbed to the adsorption sites as shown in Formula (1) below.

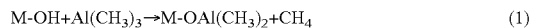

$$M\text{-}OH + Al(CH_3)_3 \rightarrow M\text{-}OAl(CH_3)_2 + CH_4 \qquad (1)$$

That is, in the above Formula (1), the OH group present in the polymer chain acts as an adsorption site. Metal oxide films, metal nitride films, and the like have no free volumes. Therefore, the film thickness required for starting two-dimensional growth is small.

That is, provision of the surface that contains O atoms or N atoms mentioned above to the inorganic material constituting the undercoat layer 12 can facilitate adsorption of the precursors, i.e., the film-forming materials (materials for forming the functional layer 13) of the atomic layer deposition film, to the adsorption sites on the surface of the undercoat layer 12. Further, in the absence of free volumes from the inorganic substance, the precursors 22 serving as the film-forming materials no longer penetrate or diffuse into the functional layer forming surface.

As described above, when an atomic layer deposition film is formed on the outer surface of an undercoat layer made of an inorganic material by means of ALD, the precursors of the atomic layer deposition film are adsorbed to the adsorption sites on the surface of the undercoat layer, so that the adsorption sites act as nuclei of the atomic layer deposition film.

Since there are no free volumes in the surface of the inorganic substance, adjacent nuclei are brought into contact with each other to make the film continuous, establishing a two-dimensional growth mode (two-dimensional growth stage of thin film) for creating a denser film.

The following description specifically addresses a method of producing the laminate of the present embodiment.

Figure 4:
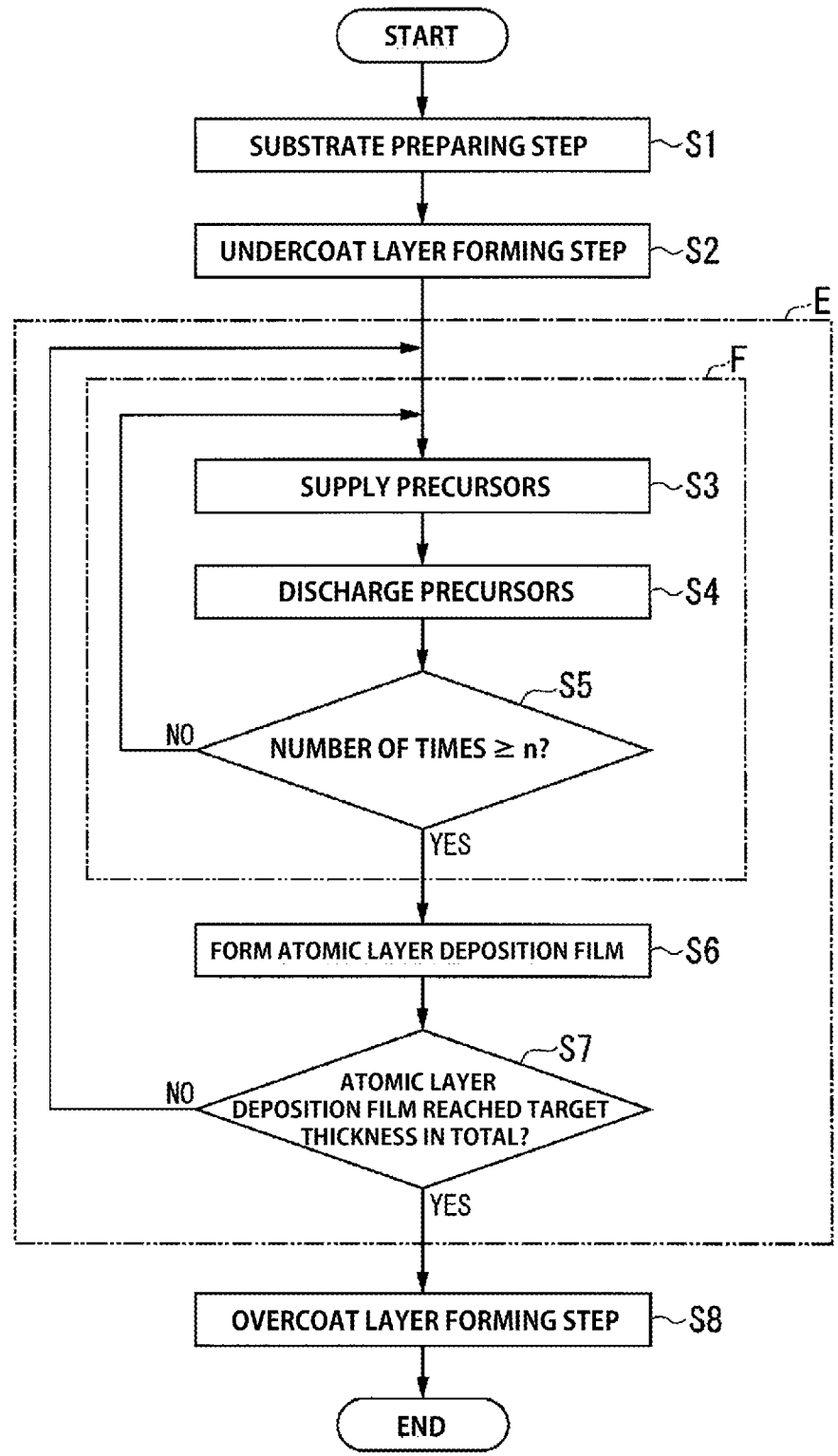
FIG. 4 is a flow diagram illustrating a method of producing the laminate according to the first embodiment, and the gas barrier film according to the second embodiment of the present invention.

FIG. 4 is a flow diagram illustrating a method of producing the laminate of the present embodiment.

Figure 5A:
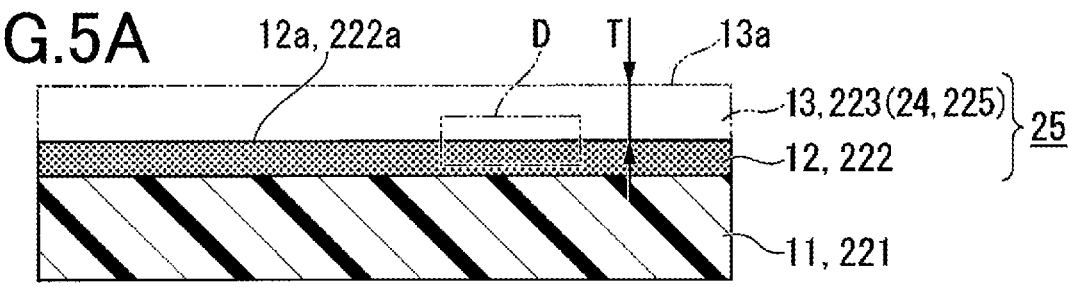
FIG. 5A is a schematic cross-sectional view at the functional layer forming step of the method of producing the laminate according to the first embodiment, and the gas barrier film according to the second embodiment of the present invention.
Figure 5B:
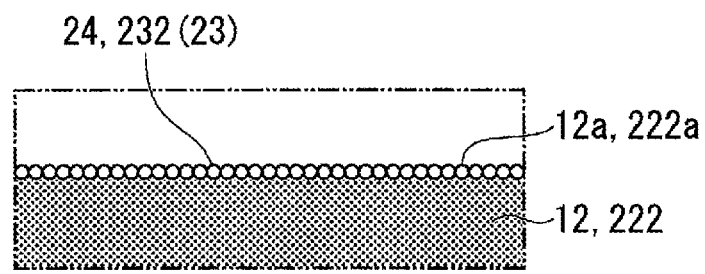
FIG. 5B is an enlarged view of the part C of FIG. 5A.

FIG. 5A is a schematic cross-sectional view of the functional layer formation step in the method of producing the laminate of the present embodiment. FIG. 5B is an enlarged view of the part D of FIG. 5A.

To produce the laminate 10 using the method of producing the laminate of the present embodiment, steps S1 to S8 shown in FIG. 4 are performed according to the flow shown in FIG. 4.

Step S1 is a substrate preparing step.

At this step, a substrate 11 made of an appropriate high-molecular-weight material is formed into a shape, for example, of a plate or film, and then placed in a vacuum chamber, not shown.

The substrate 11 may be fixed to a stage in the vacuum chamber, not shown, or may be unwound from a roll (web) of the substrate 11 and fixed to the take-up shaft.

As shown in FIG. 2B, the outer surface 11a of the substrate 11 has amorphous regions where free volume parts with no polymer chains, i.e., voids 21, are present.

At this step, the substrate 11 may firstly be placed in the vacuum chamber, not shown, and then surface treatment, such as plasma treatment or hydrolysis treatment, may be applied to the outer surface 11a of the substrate 11 for modification or activation thereof, before performing step S2. When the outer surface 11a of the substrate 11 is treated, adhesion can be enhanced between the undercoat layer formed on the outer surface 11a of the substrate 11 and the substrate 11.

After step S1, step S2 is performed. Step S2 is an undercoat layer forming step.

At this step, the undercoat layer 12 is formed on the outer surface 11a of the substrate 11.

Specifically, as shown in FIG. 5, an undercoat layer 12 containing the first inorganic substance mentioned above is formed on the outer surface 11a of the substrate 11 placed in the vacuum chamber, not shown, such as by PVD or CVD.

PVD may, for example, be induction heating, resistance heating, electron beam deposition, sputtering, or the like.

CVD may, for example, be heat CVD, plasma CVD, light CVD, or the like.

The undercoat layer 12 may be formed by a sol-gel method.

At this step, formation of the undercoat layer 12 may be followed by a treatment of plasma-exciting a gas containing O atoms, such as $O_2$, for replacement of the outer surface 12a of the undercoat layer 12 with adsorption sites, such as hydroxyl groups (OH groups).

After step S2, the process proceeds to step S3.

Steps S3 to S7 constitute a functional layer forming step E for forming the functional layer 13 described above. This step is performed through ALD.

This step will be described by way of an example of forming an $Al_2O_3$ film as an atomic layer deposition film 24.

As shown in FIG. 5, the substrate 11 resulting from step S2 is placed, for example, on the stage (not shown, this mention is omitted hereinafter) of the vacuum chamber (not shown, this mention is omitted hereinafter) of the atomic layer deposition film deposition apparatus (not shown, this mention is omitted hereinafter), with the outer surface 12a on top.

Step S3 is a precursor supplying step.

At this step, first, a gas serving as both reaction gas and discharge gas (e.g., at least one of $O_2$ and $N_2$) is introduced into the vacuum chamber. Thus, the reaction and discharge gas is supplied to the outer surface 12a of the undercoat layer 12. The pressure in the vacuum chamber then may be appropriately set, for example, within the range of 10 Pa to 50 Pa.

Then, plasma is discharged in an ICP (inductively coupled plasma) mode in the vacuum chamber. The output power source for the plasma discharge then may, for example, be a 250 W power supply. The power source for plasma gas excitation may, for example, be a 13.56 MHz power supply.

After plasma discharge, the interior of the vacuum chamber is gas-purged. The gas used for gas purging may, for example, be $O_2$, $N_2$, or the like. The reaction temperature during gas purging may, for example, be 90° C.

Then, in the vacuum chamber, trimethyl aluminum (TMA) which is a film-forming material (precursor) is supplied as a second inorganic substance to the outer surface 12a of the undercoat layer 12. In this case, the precursor serving as the film-forming material of an atomic layer deposition film 24 is supplied so as to be coupled to the adsorption sites on the outer surface 12a of the undercoat layer 12 (first step).

In the absence of void parts from the outer surface 12a of the undercoat layer 12, as shown in FIG. 5B, the precursors 23 do not permeate into the outer surface 12a of the undercoat layer 12 but are coupled to the adsorption sites, while being arrayed.

After the precursors 23 are supplied to the outer surface 12a and adsorbed to the adsorption sites, step S3 ends and the process proceeds to step S4.

At step S4, after the first step, the precursors 23 that have remained not being coupled to the adsorption sites are discharged from the vacuum chamber (second step).

Specifically, for example, the precursors 23 that have remained not being coupled to the adsorption sites are discharged from the vacuum chamber by means of a vacuum pump (not shown, this mention is omitted hereinafter) that discharges gas from the vacuum chamber.

Alternatively, for example, the precursors 23 may be discharged from the vacuum chamber by supplying an inert gas (e.g., helium, a noble gas element such as neon or argon, nitrogen, or the like) while the vacuum pump is used for exhaust ventilation of the vacuum chamber.

After the precursors 23 that have remained not being coupled to the adsorption sites are discharged from the vacuum chamber, the process proceeds to step S5.

At step S5, it is determined whether the number of times the first and second steps have been performed (number of times in FIG. 4) is equal to or more than a predetermined number of times set in advance according to the thickness of the functional layer 13 (termed predetermined number of times n (n is an integer) hereinafter).

If it is determined at step S5 that the number of times the first and second steps have been performed is equal to or more than the predetermined number of times n (YES), the process proceeds to step S6.

If it is determined at step S5 that the number of times the first and second steps have been performed is less than the predetermined number of times n (NO), the process returns to step S3 and steps S3 and S4 are repeated. The predetermined number of times n may, for example, be 15 times.

The third step F shown in FIG. 4 is a step of repeating the first step (step S3) and the second step (step S4) a predetermined number of times.

At step S6, a reaction gas is supplied into the vacuum chamber, and a voltage is applied to the reaction gas to generate plasma and cause reaction between the plasma and the precursors 23. As a result, an atomic layer deposition film 24 having a thickness corresponding to one atomic layer is formed (fourth step).

Specifically, for example, a reaction gas (e.g., $O_2$, $N_2$, $CO_2$, $H_2$, or a mixture gas of two or more of these gases) is supplied into the vacuum chamber. The pressure in the vacuum chamber then may be appropriately set, for example, within the range of 10 Pa to 50 Pa.

Supply of the reaction gas is followed by plasma discharge in an ICP (inductively coupled plasma) mode in the vacuum chamber to generate plasma. The power source for plasma gas excitation used at this step may, for example, be a 13.56 MHz power supply.

The reaction between the plasma and the precursors 23 results in formation of an atomic layer deposition film 24 with a thickness of one atomic layer.

Another method applicable to this step may, for example, be introducing $H_2O$ or $H_2O_2$ into the vacuum chamber, and carrying out plasma discharge in an ICP mode as with the above example to cause reaction between $H_2O$ or $H_2O_2$ and the precursors 23 and thereby form an atomic layer deposition film 24 with a thickness of one atomic layer.

Upon completion of the process of step S6, the process proceeds to step S7.

At step S7, it is determined whether the total thickness of the formed atomic layer deposition film 24 (i.e., the total thickness of the laminated atomic layer deposition film 24)

has reached a preset target thickness of the functional layer 13 (termed thickness T hereinafter).

The thickness of the functional layer 13 is calculated based on the product of the growth rate confirmed beforehand and the number of cycles.

If it is determined at step S7 that the total thickness of the formed atomic layer deposition film 24 has reached the thickness T (target thickness) of the functional layer 13 (determined as YES), the functional layer forming step E is completed and the process proceeds to step S8.

If it is determined at step S7 that the total thickness of the formed atomic layer deposition film 24 has not reached the thickness T of the functional layer 13 (determined as NO), the process returns to step S3, and steps S3 to S6 are similarly repeated as described above.

As described above, the atomic layer deposition film 24 is formed, for example, from an $Al_2O_3$ film by performing a cycle of steps S3 to S7 a plurality of times. The number of cycles may be previously determined based on the atomic layer deposition film 24 formed in one cycle and the thickness required of the functional layer 13.

The number of cycles may be in the range, for example, of 2 or more to 1,000 or less, more preferably, 2 or more to 200 or less.

The preset target thickness T of the functional layer 13 may be 20 nm or less, for example.

In this way, the functional layer 13 is formed so that the thickness T will be 20 nm or less in the functional layer forming step E. With this way of formation, for example, performance of the functional layer 13, such as gas barrier performance, is well exerted, while cost, productivity, and reliability are ensured.

Step S8 is an overcoat layer forming step of forming the overcoat layer 14.

At this step, a structure 25 including the formed atomic layer deposition film 24 with the thickness T (see the dash-dot-dot line), as shown in FIG. 5A, is taken out of the vacuum chamber of the atomic layer deposition film forming apparatus. Then, the structure 25 is fixed onto a stage (not shown, mention is omitted hereinafter) of a deposition chamber (not shown, mention is omitted hereinafter) of an overcoat layer forming apparatus (not shown, mention is omitted hereinafter).

In this case, the structure 25 is fixed so that the outer surface 13a of the functional layer 13 is on top.

After that, an overcoat layer 14 containing a third inorganic substance is formed by PVD or CVD, covering the outer surface 13a of the functional layer 13.

In this way, the overcoat layer 14 is formed covering the outer surface 13a of the functional layer 13. With this way of formation, the functional layer 13 is protected from environmental stresses, particularly, from high temperature and high humidity, while the undercoat layer 12 and the functional layer 13 are protected from mechanical stress.

The overcoat layer 14 contains the third inorganic substance, as mentioned above, having a composition that provides an environmental stress resistance that is equal to or higher than that of the composition of the second inorganic substance contained in the functional layer 13. Accordingly, the functional layer 13 is protected from deterioration that would otherwise be caused by environmental stress. Thus, reliability of the laminate 10 is improved by forming the overcoat layer 14.

When the overcoat layer 14 is formed, step S8 ends, and the method of producing a laminate of the present embodiment ends. The laminate 10 as shown in FIG. 1 is thus produced.

The method of producing the laminate 10 has been described so far. The same producing method can be applied to a laminate 10 serving as a gas barrier film.

However, if the laminate 10 serves as a gas barrier film, a film substrate is used as the substrate 11.

Further, the laminate 10 serving as a gas barrier film may be constituted solely by itself, or may be laminated with another substrate via, for example, an adhesive or the like. Further, the gas barrier film including the laminate 10 may be provided with an organic light-emitting element.

The gas barrier film including the laminate 10 can protect the packaged contents from gases, such as oxygen or water vapor, to be shielded. Thus, such a gas barrier film may be used in various fields such as of food packaging, medicines, electronic parts, agricultural materials, and other fields.

The laminate 10 in a gas barrier film may have a water vapor transmission rate, for example, of 0.5 $g/m^2/day$ [the same as $g/(m^2\ day)$] or less.

If the water vapor transmission rate of the laminate 10 is more than 0.5 $g/m^2/day$, and if, for example, materials are packed using the gas barrier film, the packed materials are likely to be chemically altered because the shielding effect for oxygen or water vapor is small.

With the laminate 10 having a water vapor transmission rate of 0.5 $g/m^2/day$ or less, the packaged materials can be protected by the gas barrier film (the quality of the packaged materials can be maintained).

As described above, according to the laminate 10 of the present embodiment, the undercoat layer 12 is formed on the substrate 11 made of a high-molecular-weight material. Thus, the atomic layer deposition film 24 is densely formed on the undercoat layer 12. Further, the functional layer 13 formed from the atomic layer deposition film 24 is covered with the overcoat layer 14. This configuration improves reliability of the laminate 10 including the substrate 11 made of a high-molecular-weight material, and the functional layer 13 formed from the atomic layer deposition film 24 provided on the substrate 11.

According to the gas barrier film including the laminate 10, reliability and gas barrier properties can be improved.

The undercoat layer 12 covers the free volumes in the substrate 11, and has adsorption sites on the outer surface 12a for the precursors 23. Thus, the undercoat layer 12, while allowing the precursors 23 used for forming the atomic layer deposition film 24 to be easily adsorbed to the adsorption sites, can form a surface having no free volumes. Therefore, the undercoat layer 12 eliminates permeation and diffusion of the precursors 23 into the substrate 11. As a result, the atomic layer deposition film 24 grows two-dimensionally on the outer surface 12a from the initial formation stage, for formation into a dense atomic layer deposition film 24 in a short period of time.

Since the atomic layer deposition film 24 is densely formed in this way, the functional layer 13 that is the atomic layer deposition film 24 has good gas barrier properties even if the thickness is small.

In addition, the atomic layer deposition film is formed more densely. Therefore, the atomic layer deposition film becomes chemically stable, and further, the adhesion between the undercoat layer and the functional layer that is the atomic layer deposition film is secured. Thus, the performance is prevented from being impaired due to environmental stress.

Since the functional layer 13 of the laminate 10 is covered with the overcoat layer 14, its resistance to environmental stress or mechanical stress is improved as compared with the case where the overcoat layer 14 is not provided.

According to the method of producing a laminate of the present embodiment, the functional layer 13 is formed by ALD in the absence of free volumes from the outer surface 12a, thanks to the undercoat layer 12 formed through the undercoat lamination step.

Therefore, even if the substrate 11 is made of a high-molecular-weight material and has free volumes in the outer surface 11a, free volumes are absent from the outer surface 12a. Thus, adjacent nuclei are brought into contact with each other to make the atomic layer deposition film 24 continuous. As a result, for the atomic layer deposition film 24, a thin film grows two-dimensionally from the initial growth stage. Therefore, the atomic layer deposition film 24 becomes a dense film at an earlier stage of fabrication, and accordingly a film having high gas barrier performance can be formed in a short time.

The above embodiment has been described by way of an example where the third step of repeating step S3 (first step of supplying precursors) and step S4 (second step of discharging precursors) is performed a predetermined number of times, followed by performing step S6 (fourth step of forming an atomic layer deposition film deposited on an atomic layer basis), which is further followed by repeating the first to fourth steps a plurality of times.

However, the first to fourth steps may be performed only once. That is, the atomic layer deposition film 24 may be formed of only one atomic layer.

Second Embodiment

Figure 6:
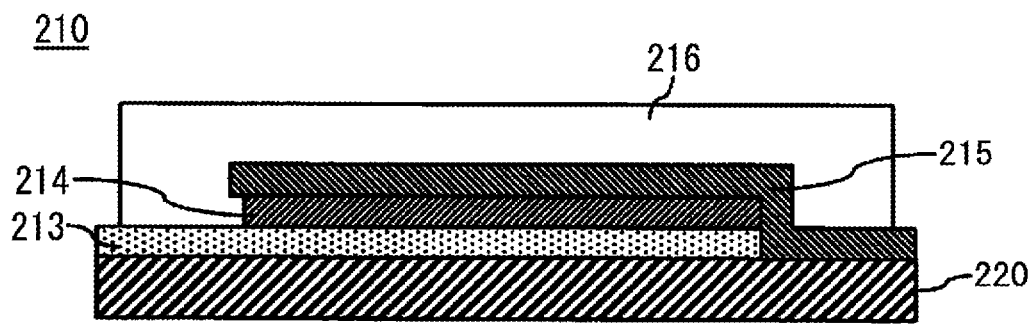
FIG. 6 is a schematic cross-sectional view illustrating an organic light-emitting element according to the second embodiment of the present invention.

FIG. 6 is a schematic cross-sectional view illustrating an organic light-emitting element according to a second embodiment of the present invention. As shown in FIG. 6, an organic light-emitting element 210 of the present embodiment includes a gas barrier film 220, a first electrode 213, a light-emitting layer 214, a second electrode 215, and a sealing cap 216.

Figure 7:
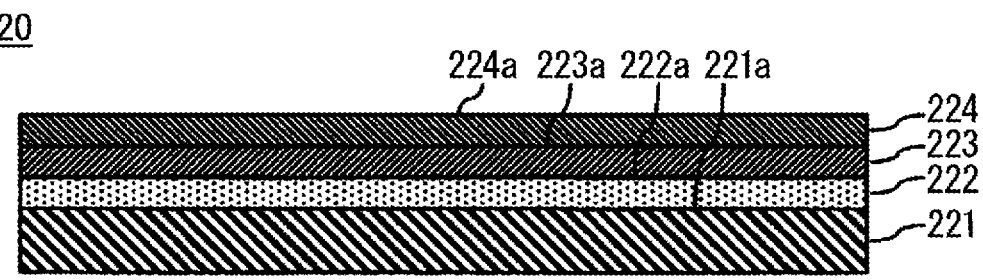
FIG. 7 is a schematic cross-sectional view illustrating a gas barrier film according to the second embodiment of the present invention.

FIG. 7 is a schematic cross-sectional view illustrating a layered configuration of the gas barrier film 220. To be specific, the gas barrier film 220 has a film substrate 221, an undercoat layer 222, a functional layer 223, and an overcoat layer 224.

The film substrate 221 is made of a high-molecular-weight material. The film substrate 221 has an outer surface 221a on which the undercoat layer 222 is formed. Since the first inorganic substance acting as the undercoat layer 222 is formed by PVD or CVD, the high-molecular-weight material constituting the film substrate 221 is not particularly limited, but any high-molecular-weight material may be used. The film substrate 221 has a configuration similar to that of the substrate 11 in the laminate 10 of the first embodiment.

The film substrate 221 preferably has a thickness in the range, for example, of 12 to 300 μm, more preferably in the range of 12 to 100 μm.

As shown in FIG. 7, the undercoat layer 222 is provided covering the outer surface 221a of the film substrate 221. The undercoat layer 222 has an outer surface 222a. The undercoat layer 222 is formed of a film containing the first inorganic substance, and has adsorption sites capable of chemically adsorbing precursors 232, i.e., the material for forming the atomic layer deposition film. The undercoat layer 222 has a configuration similar to that of the undercoat layer 12 in the laminate 10 of the first embodiment.

The functional layer 223 is provided covering the outer surface 222a of the undercoat layer 222. The functional layer 223 has an outer surface 223a. In the functional layer 223, the adsorption sites on the outer surface 222a of the undercoat layer 222 are coupled to the precursors constituting the film-forming materials. Specifically, the functional layer 223 is a film formed by atomic layer deposition (ALD). The functional layer 223 has a configuration similar to that of the functional layer 13 in the laminate 10 of the first embodiment.

The overcoat layer 224 is provided covering the outer surface 223a of the functional layer 223. In this way, the laminate includes the overcoat layer 224 covering the outer surface 223a of the functional layer 223. Accordingly, the functional layer 223 is protected from environmental stress, particularly, from high temperature and high humidity, while the undercoat layer 222 and the functional layer 223 are protected from mechanical stress. The overcoat layer 224 has a configuration similar to that of the overcoat layer 14 in the laminate 10 of the first embodiment.

The thickness of the overcoat layer 224 may be set as appropriate, for example, in the range of 3 nm or more to 1,000 nm or less. If the thickness of the overcoat layer 224 is less than 3 nm, no protective effect is exerted against environmental stress. If the thickness of the overcoat layer 224 is more than 1,000 nm, defects, such as cracks, are generated due to bending or thermal expansion of the film.

As described above, the laminate includes the film substrate 221 made of a high-molecular-weight material; the undercoat layer 222 containing the first inorganic substance and formed on the outer surface 221a of the film substrate 221; the functional layer 223 configured by the atomic layer deposition film 225 and located on the outer surface 222a of the undercoat layer 222, the layer 223 being formed using the precursors that contain the second inorganic substance and can be coupled to adsorption sites located on the outer surface 222a of the undercoat layer 222; and the overcoat layer 224 containing the third inorganic substance and formed on the outer surface 223a of the functional layer 223. With this configuration, the functional layer 223, i.e., the atomic layer deposition film, can be formed on the undercoat layer 222 containing the first inorganic substance, with no free volumes, and thus the atomic layer deposition film can grow two-dimensionally at an earlier stage.

Forming the functional layer 223 on the undercoat layer 222, the functional layer 223, i.e., the atomic layer deposition film, becomes dense, and gas barrier performance and durability are improved.

In addition, providing the overcoat layer 224 covering the outer surface 223a of the functional layer 223, the overcoat layer can cover the defect of water vapor permeation of the functional layer 223, thereby improving gas barrier performance. Furthermore, providing the overcoat layer 224, the outer surface 223a side of the functional layer 223 is protected from environmental stress, mechanical stress, and the like, and accordingly is prevented from being deteriorated or damaged. Thus, durability of the laminate 220 is improved.

The following description addresses a sealing film (not shown).

The sealing film (not shown) according to the present embodiment includes the gas barrier film 220 shown in FIG. 7.

For example, the sealing film may be formed of only the gas barrier film 220. The sealing film may have a configuration in which the gas barrier film 220 is laminated on another substrate via an adhesive. After forming an organic light-emitting element, the sealing film may be bonded thereto. Alternatively, an organic light-emitting element may be formed directly on the sealing film (or gas barrier film 220) serving as the substrate.

The gas barrier film 220 constituting the sealing film may have a water vapor transmission rate, for example, of 0.01 g/m$^2$/day or less. If the water vapor transmission rate of the gas barrier film 220 constituting the sealing film is more than 0.01 g/m$^2$/day, the organic light-emitting element cannot be protected from oxygen or water vapor, and the light-emitting layer stops emitting light, that is, many dark spots are generated. Thus, with the water vapor transmission rate of the gas barrier film 220 being 0.01 g/m$^2$/day or less, the organic light-emitting element and the electronic device including the element can maintain their performance.

FIG. 4 is a flow diagram illustrating the method of producing the gas barrier film according to the present embodiment. The gas barrier film 220 of the present embodiment can be produced similarly to the method of producing the laminate 10 of the first embodiment.

In the present embodiment, at step S2, the undercoat layer 222 containing the first inorganic substance is formed by physical vapor deposition (PVD) or chemical vapor deposition (CVD) on the outer surface 221a of the film substrate 221 fixed to the stage in the vacuum chamber, or the film substrate 221 in the form of a roll (web) wound around the shaft in the vacuum chamber (undercoat layer forming step).

The functional layer 223 is preferably formed, for example, with a thickness of 200 nm or less. If the thickness of the functional layer 223 is more than 200 nm, cracks or the like are likely to occur due to the internal stress of the film. Thus, with the thickness being set to 200 nm or less, reliability of the functional layer 223 can be secured.

The functional layer 223 is more preferably formed with a thickness of 20 nm or less. The functional layer 223 with a thickness of more than 20 nm will result in high cost and low productivity. The thickness of the functional layer 223 being 0.5 nm or more and 20 nm or less is more preferable, for example. If the thickness of the functional layer 223 is less than 0.5 nm, barrier performance of the functional layer 223 is less likely to be exerted.

In this way, the overcoat layer 224 is formed covering the outer surface 223a of the functional layer 223. With this way of formation, the functional layer 223 is protected from environmental stresses, particularly, from high temperature and high humidity, while the undercoat layer 222 and the functional layer 223 are protected from mechanical stress.

Further, the overcoat layer 224 contains the third inorganic substance having a composition that provides an environmental stress resistance that is equal to or higher than that of the composition of the second inorganic substance contained in the functional layer 223. Accordingly, the functional layer 223 is protected from deterioration that would otherwise be caused by environmental stress, and thus reliability of the gas barrier film 220 is improved.

The method of producing the laminate of the present embodiment includes: a step of forming the undercoat layer 222 containing the first inorganic material by physical or chemical vapor deposition on the outer surface of the film substrate 221 which is made of a high-molecular-weight material and placed in a vacuum chamber; a functional layer forming step of permitting the precursors 232 serving as materials for forming the atomic layer deposition film 225 to react, by atomic layer deposition, with the adsorption sites that are present in the outer surface 222a of the undercoat layer 222 to form the functional layer 223; and an overcoat layer forming step of forming the overcoat layer 224 containing the third inorganic substance so as to cover the outer surface 223a of the functional layer 223. With this method, the atomic layer deposition film 225 is formed on the undercoat layer 222 without the precursors 232 entering into the voids in the amorphous parts of the substrate 211.

Thus, a thin film of the functional layer 223 can exert barrier performance (i.e., high barrier properties), and also the resistance of the functional layer 223 to environmental stress and the like is improved.

Further, forming the overcoat layer 224 covering the outer surface 223a of the functional layer 223, damage or alteration is reduced or prevented in the outer surface 223a side of the functional layer 223, and therefore gas barrier properties of the gas barrier film 220 are maintained.

Furthermore, since the overcoat layer 224 compensates for the defect of gas permeation through the functional layer 223, barrier performance is improved.

The first electrode layer 213, the light-emitting layer 214, the second electrode layer 215, and the sealing cap 216 are formed on the gas barrier film 220 as described above. The organic light-emitting element 210 shown in FIG. 6 is formed. The basic configuration of the organic light-emitting element 210 is as described above. However, the choice of the organic layer (low- or high-molecular-weight material herein) used for the light-emitting layer 214 may be appropriately made. Also, as necessary, a hole injection layer and a hole transport layer may be formed between the first electrode 213 and the light-emitting layer 214, and an electron injection layer and an electron transport layer may be formed between the second electrode 214 and the light-emitting layer 214.

Third Embodiment

Figure 8:
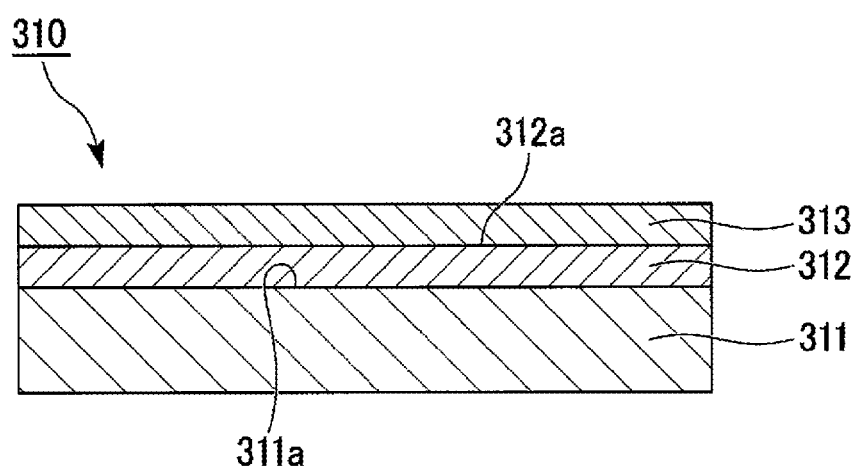
FIG. 8 is a schematic cross-sectional view illustrating a laminate according to a third embodiment of the present invention.

FIG. 8 is a schematic cross-sectional view illustrating a laminate according to a third embodiment of the present invention. The present embodiment will be described by way of an example in which a film substrate is used as a substrate 311 configuring a laminate 310.

The laminate 310 according to an embodiment of the present invention includes a substrate 311 made of an organic polymer, an atomic layer deposition film 313, and a primer layer 312. The substrate 311 is made of an organic polymer. Between the substrate 311 and the atomic layer deposition film 313, the primer layer 312 contains functional groups serving as coupling sites (adsorption sites) to which the precursors serving as film-forming materials of the atomic layer deposition film 313 are coupled. The primer layer is made of an inorganic material having pores of a small diameter.

The precursors coupled to the adsorption sites of the primer layer 312 with sufficient density are coupled to each other establishing crosslinkage. Thus, the atomic layer deposition film 313 is two-dimensionally formed in the planar direction (planar direction parallel to the outer surface 312a) of the primer layer 312.

As a result, gaps through which gases would otherwise pass are unlikely to be formed in the atomic layer deposition film 313 in the thickness direction of the laminate 310. Accordingly, an atomic layer deposition film 313 having high gas barrier properties is obtained.

An adhesive layer (e.g., a resin layer containing an organic polymer), not shown, may be disposed between the substrate 311 and the primer layer 312. Providing an adhesive layer between the substrate 311 and the primer layer 312, the adhesion strength between the substrate 311 and the primer layer 312 is improved.

The substrate of the laminate of the present invention is made of an organic polymer. However, as described above, the processing of atomic layer deposition (ALD) applied to such substrates has not been specifically studied as compared with substrates used for electronic components.

Generally, organic polymers include spaces called free volumes having no polymer chains, through which gases unavoidably diffuse and pass. However, not only organic polymers but also inorganic materials may have pores in which gases may diffuse.

As described above, when forming an atomic layer deposition film by ALD on the outer surface (front surface) of a primer layer made of an inorganic material having large pores, the precursors serving as film-forming materials of the atomic layer deposition film internally diffuse from the outer surface (front surface) of the primer layer, become adsorbed to the three-dimensionally scattered adsorption sites. These adsorption sites become the nuclei of the atomic layer deposition film.

Since the nuclei are three-dimensionally scattered, the growth mode will be three-dimensional until the adjacent nuclei come into contact with each other for formation of a continuous film, and then the growth mode becomes two-dimensional.

That is, when an atomic layer deposition film is formed by ALD on the outer surface of a primer layer made of an inorganic material having large pores, a longer time is taken from the start of the process of forming the atomic layer deposition film until the completion of forming a dense film through two-dimensional growth.

Therefore, smaller thickness of the atomic layer deposition film leads to considerably reducing parts where two-dimensional growth of the atomic layer deposition film is dense.

In the atomic layer deposition film having such a structure, gas barrier performance of the atomic layer deposition film is impaired, allowing gases to pass through the gaps formed in the atomic layer deposition film.

In this regard, the inventors of the present have reached an idea of providing a primer layer, which is made of an inorganic material having pores of a small diameter, on the outer surface of a substrate made of an organic polymer to prevent the precursors from diffusing into the primer layer.

That is, in order to two-dimensionally and densely provide the adsorption sites for the precursors serving as the film-forming materials of the atomic layer deposition film, over the outer surface (front surface) of the substrate made of an organic polymer, a primer layer made of an inorganic material having pores of a small diameter should be provided, prior to ALD, to the outer surface (front surface) of the substrate made of an organic polymer.

Providing a primer layer made of an inorganic material having pores of a small diameter over the outer surface (front surface) of the substrate made of an organic polymer in this way, there should be no diffusing of the gas containing the precursors into the primer layer.

<Laminate>

Referring to FIG. 8, the laminate 310 of the present embodiment includes the substrate 311, the primer layer 312, and the atomic layer deposition film 313.

<Substrate>

The substrate 311 is made of an organic polymer. The substrate 311 has the outer surface 311a on which the primer layer 312 is formed.

Examples of the organic polymer forming the substrate 311 include polyethylene (PE), polypropylene (PP), polystyrene (PS), polyethylene terephthalate (PET), polyethylene naphthalate (PEN), nylon, polyimide (PI), polycarbonate (PC), and polyether sulfone (PES).

The substrate 311 may be the same as that of the first or second embodiment.

<Primer Layer>

The primer layer (undercoat layer) 312 is provided to at least part of the outer surface 311a of the substrate 311. The primer layer 312 is made of an inorganic material having pores of a small diameter, and has the outer surface 312a on which the atomic layer deposition film 313 is formed.

That is, as compared with the outer surface (front surface) of the primer layer disclosed in PTL 7, the outer surface 312a (front surface) of the primer layer 312 includes fewer or no pores that allow the precursors to diffuse into the primer layer 312.

Thus, the time taken from the start of the processing of forming the atomic layer deposition film 313 until the completion of forming a dense film through two-dimensional growth is shorter than in the conventional method (in other words, it is less likely that the precursors serving as the film-forming materials penetrate into the primer layer 312 having pores of a small diameter). Therefore, even when the thickness of the atomic layer deposition film 313 is made smaller (e.g., 0.5 nm), the dense parts are increased in the atomic layer deposition film 313 obtained through two-dimensional growth, and thus sufficient gas barrier properties are obtained even when the thickness of the atomic layer deposition film 313 is made smaller.

The inorganic material contained in the primer layer 312 may, for example, be at least one selected from the group consisting of Al, Si, Ti, Zn, Sn, Ta, Hf, W, Nb, V, Ti, Ge, Co and Ni, or may be an oxide, a nitride, or a mixture of an oxide and a nitride of the inorganic materials. That is, the primer layer 312 may contain an inorganic material similar to the undercoat layer of the first or second embodiment.

The maximum diameter of the pores in the primer layer 312 is preferably 1.0 nm or less.

If the maximum pore diameter exceeds 1.0 nm, it means that the diameters of the pores are larger than the molecular sizes of most of the precursors used for ALD. This is not preferred because, to obtain high gas barrier properties, the precursors need to diffuse into the primary layer 312 so as to make the atomic layer deposition film 313 thick (e.g., 3 nm or more) to the level of filling the pores of the primer layer 312.

In the present embodiment, the diameters of pores in the primer layer 312 were evaluated by way of an evaluation of a maximum pore diameter therein using a pulse beam type positron annihilation lifetime spectroscopy device (PALS device, e.g., PALS-1 (trade name) manufactured by Fuji Imvac Inc.). The maximum pore diameter in the primer layer 312 corresponds to the pore diameter that is the largest among the diameters of the pores whose existence probability is 0.0001 or more in the pore diameter measurement using a PALS device, when the existence probability of all the pores having a diameter of 10 nm or less is taken to be 1.

The primer layer 312 preferably has a thickness in the range, for example, of 1.0 nm or more to 1,000 nm or less, more preferably 10 nm or more to 100 nm or less.

If the thickness of the primer layer 312 is less than 1.0 nm, the density of the adsorption sites will be insufficient, and thus sufficient water vapor barrier properties cannot be imparted to the atomic layer deposition film 313. If the thickness of the primer layer 312 exceeds 1,000 nm, a large amount of materials may be required and a long time may be taken for deposition, and further, cracks or defects may occur in the primer layer 312.

It is possible to increase the density of the adsorption sites by applying plasma etching or hydrolysis treatment to the outer surface 312a of the primer layer 312. In this case, the inorganic material contained in the primer layer 312 may, for example, be an inorganic oxide in which the M-O-M bond is ring-opened by plasma etching or the like and M-OH groups are formed.

FIG. 8 shows an example in which the primer layer 312 is disposed covering the outer surface 311a of the substrate 311. However, the primer layer 312 may only have to be provided over at least part of the outer surface 311a of the substrate 311, and thus the configuration is not limited to one shown in FIG. 8.

FIG. 8 shows an example in which the primer layer 312 is disposed so that the outer surface 311a of the substrate 311 is in contact with the primer layer 312. However, for example, an adhesive layer (e.g., a resin layer containing an organic polymer), not shown, may be disposed between the substrate 311 and the primer layer 312.

Providing an adhesive layer between the substrate 311 and the primer layer 312, the adhesion strength between the substrate 311 and the primer layer 312 is improved.

<Atomic Layer Deposition Film>

The atomic layer deposition film (functional layer) 313 is provided on at least part of the outer surface 312a of the primer layer 312.

The atomic layer deposition film 313 contains precursors (e.g., metal-containing precursors such as TMA: tri-methyl aluminum and $TiCl_4$), which serve as materials for forming the atomic layer deposition film 313, and those precursors which are on the outer surface 312a of the primer layer 312 are coupled to the adsorption sites of the inorganic substance.

The atomic layer deposition film 313 may, for example, be an inorganic oxide film containing an inorganic oxide of Al, Ti, Si, Zn, Sn, Zr, Hf, Ta, or the like, or a nitride film or an oxynitride film containing such inorganic oxides. For example, such an atomic layer deposition film 313 may be an aluminum oxide ($Al_2O_3$) film. That is, the atomic layer deposition film 313 may have a configuration similar to that of the functional layer of the first or second embodiment.

The atomic layer deposition film 313 preferably has a thickness in the range, for example, of 0.5 nm or more to 200 nm or less, and more preferably, 1 nm or more to 50 nm or less.

If the thickness of the atomic layer deposition film 313 is less than 0.5 nm, sufficient water vapor barrier properties cannot be imparted to the atomic layer deposition film 313, from the producing technique point of view. If the thickness of the atomic layer deposition film 313 exceeds 200 nm, a large amount of materials will be required and a long time is taken for deposition.

Therefore, with the thickness of the atomic layer deposition film 313 being in the range of 0.5 nm or more to 200 nm or less, sufficient water vapor barrier properties can be imparted in a short time to the atomic layer deposition film 313 obtained.

FIG. 8 shows an example in which the atomic layer deposition film 313 is disposed covering the outer surface 312a of the primer layer 312. However, the atomic layer deposition film 313 may only have to be provided over at least part of the outer surface 312a of the primer layer 312, and thus the configuration is not limited to the one shown in FIG. 8.

The laminate 310 of the present embodiment includes the substrate 311 made of an organic polymer, the primer layer 312 provided to at least part of the outer surface 311a of the substrate 311 and made of an inorganic material having pores of a small diameter, and the atomic layer deposition film 313 provided to at least part of the outer surface 312a of the primer layer 312. Thus, the time taken from the start of the processing of forming the atomic layer deposition film 313 until completion of forming a dense film through two-dimensional growth is shorter than in the conventional methods. Thus, even when the thickness of the atomic layer deposition film 313 is small (e.g., 0.5 nm or more to 200 nm or less), the dense part is increased in the atomic layer deposition film 313 obtained through two-dimensional growth, and thus sufficient gas barrier properties can be obtained even when the thickness of the atomic layer deposition film 313 is small.

In addition, since the atomic layer deposition film 313 has sufficient gas barrier properties, high gas barrier properties can be imparted to the laminate 310 obtained.

The laminate 310 preferably has a water vapor transmission rate, for example, of $1.0 \times 10^{-2}$ g/(m² day) or less. With the water vapor transmission rate of more than $1.0 \times 10^{-2}$ g/(m² day), the laminate 310 can be used for food packaging, but cannot protect electronic components whose properties change with a very small amount of moisture. Thus, with the water vapor transmission rate being equal to or less than $1.0 \times 10^{-2}$ g/(m² day), the laminate 310 can be used as a protective layer of an electronic component that is an application example of the present invention.

As in the first and second embodiments, the laminate 310 of the present embodiment may have an overcoat layer covering the outer surface of the atomic layer deposition film 313.

<Method of Producing Laminate>

Referring to FIG. 8, description will be given of a method of producing the laminate 310 of the present embodiment.

First, a primer layer 312 is formed on at least part of the outer surface 311a of the substrate 311 made of an organic polymer (primer layer forming step).

The primer layer 312 may be formed such as by PVD (e.g., induction heating, resistance heating, electron beam vapor deposition, or sputtering) or CVD (e.g., thermal CVD, plasma CVD, or light CVD).

A specific method of forming the primer layer 312 will be described by way of an example of forming a primer layer 312 containing $SiO_x$.

First, a substrate 311 in the absence of the primer layer 312 is fixed to a stage in a vacuum chamber (not shown).

Then, the pressure in the vacuum chamber (pre-deposition pressure) is set, for example, to $2 \times 10^{-3}$ Pa. The temperature in the vacuum chamber in this case may be set to, for example, 30° C.

Then, after electron beams have been irradiated to the vapor deposition material and the pressure (pressure during deposition) in the vacuum chamber has reached, for example, to $1 \times 10^{-2}$ Pa, electron beam vapor deposition is applied to at least part of the outer surface 311a of the substrate 311 to form the primer layer 312 containing $SiO_x$ (X is in the range of 1.0 or more to 2.0 or less).

Thus, the primer layer 312 having pores with a maximum diameter of 1.0 nm or less can be formed.

When an adhesive layer (not shown) is to be formed on the outer surface 311a of the substrate 311, the adhesive layer is formed prior to the primer layer forming step described above.

For example, the adhesive layer is formed by applying a coating liquid (liquid serving as the base material of the adhesive layer) onto the outer surface 311a of the substrate 311 by means of a wire bar, and then drying the coating liquid.

The coating liquid can be prepared, for example, by dissolving an organic polymer that is a copolymer of poly (methacrylic acid-2-hydroxyethyl) and polymethacrylic acid methyl, wherein the ratio of poly (methacrylic acid-2-hydroxyethyl) is 35 mol %, in a mixture solution of methyl ethyl ketone and cyclohexanone.

The adhesive layer is not an essential component for the present invention, and may be provided as necessary.

Then, precursors serving as the film-forming materials are supplied to the outer surface 312a of the primer layer 312 to form the atomic layer deposition film 313 on at least part of the outer surface 312a of the primer layer 312 (atomic layer deposition film forming step).

That is, in the atomic layer deposition film forming step, the atomic layer deposition film 313 is preferably formed by atomic layer deposition (ALD). The laminate 310 is produced in this way.

Specifically, when an $Al_2O_3$ film is to be formed as the atomic layer deposition film 313, the following method may be used, for example.

First, the substrate 311 on which the primer layer 312 is formed is fixed to a stage (not shown) in a deposition chamber (not shown) of an atomic layer deposition film forming device (not shown).

Then, the pressure in the deposition chamber (pressure before deposition) is set to 0.5 Pa, followed by introducing a gas that serves both as a reaction gas and an electrical discharge gas (e.g., at least one of $O_2$ and $N_2$) into the deposition chamber, so that the reaction and discharge gas is supplied to the outer surface 312a of the primer layer 312 (step 1).

The pressure in the deposition chamber then may be appropriately set in the range, for example, of 10 Pa to 50 Pa.

The power source for plasma gas excitation may, for example, be a 13.56 MHz power supply.

Then, plasma discharge is performed in an ICP (inductively coupled plasma) mode in the deposition chamber (Step 2).

The output power for the plasma discharge then may, for example, be 250 W.

After the plasma discharge, the interior of the deposition chamber is gas-purged (step 3).

The gas used for gas purging may, for example, be $O_2$, $N_2$, or the like.

The reaction temperature during gas purging may, for example, be 90° C.

Then, trimethylaluminum (TMA) as a film-forming material (precursor), and purge gas (e.g., Ar and $N_2$) are simultaneously supplied into the deposition chamber (step 4).

Then, only the purge gas (e.g., Ar and $N_2$) is supplied into the deposition chamber (step 5).

Then, the reaction and discharge gas (e.g., $O_2$) is supplied into the deposition chamber.

The pressure in the deposition chamber then may be appropriately set, for example, within the range of 10 Pa or more to 50 Pa or less. After that, plasma discharge is performed in an ICP (inductively coupled plasma) mode in the deposition chamber (step 6), and one atomic layer of an Al2O3 film (part of the atomic layer deposition film 313) is formed on the outer surface 312a of the primer layer 312. The power source for plasma gas excitation used then may, for example, be a 13.56 MHz power supply.

Then, only the purge gas (e.g., Ar and $N_2$) is supplied into the deposition chamber (step 7).

The atomic layer deposition film 313 formed of an $Al_2O_3$ film is formed by performing a cycle of steps 4 to 7 a plurality of times.

Prior to the atomic layer deposition film formation step, surface treatment may be applied to the outer surface 312a of the primer layer 312 (e.g., plasma treatment (plasma etching treatment), corona treatment, or alkali treatment) to thereby improve the reactivity and density of the adsorption sites of the outer surface 312a of the primer layer 312.

The method of producing a laminate of the present embodiment includes the primer layer forming step of forming the primer layer 312 having pores with a maximum diameter of 1.0 nm or less using an inorganic material, on at least part of the outer surface 311a of the substrate 311 which is made of an organic polymer and placed in a vacuum chamber (not shown), and the atomic layer deposition film forming step of supplying precursors as film-forming materials to at least part of the outer surface 312a of the primer layer 312 to form the atomic layer deposition film 313. Thus, the time taken from the start of the processing of forming the atomic layer deposition film 313 until completion of forming a dense film through two-dimensional growth is shorter than in the conventional methods (i.e., the precursors are less likely to enter the free volume spaces). Thus, even when the thickness of the atomic layer deposition film 313 is small (e.g., 0.5 nm), the dense part is increased in the atomic layer deposition film 313 obtained through two-dimensional growth, and thus sufficient gas barrier properties can be obtained even when the thickness of the atomic deposition film 313 is small.

In addition, since the atomic layer deposition film 313 has sufficient gas barrier properties, high gas barrier properties can be imparted to the laminate 310 obtained.

EXAMPLES

The following description addresses Examples 1 to 7 of the laminate of the above embodiments, and Comparative Examples 1 to 10. However, the present invention should not be limited to the following Examples 1 to 7.

Table 1 shows the configurations and evaluations of the laminates of Examples 1 to 3 and Comparative Examples 1 to 4. In Table 1, however, reference signs are omitted.

TABLE 1

| | | Laminate structure | | | Water vapor transmission rate [g/m²/day] | | | |
|---|---|---|---|---|---|---|---|---|
| | Substrate | Undercoat layer | Functional layer (ALD film) | Overcoat layer | Before durability test | After durability test | Before mechanical stress test | After mechanical stress test |
| Ex. 1 | PI substrate (25 μm) | $Ta_2O_5$ film (20 nm) | $Al_2O_3$ film (10 nm) | $Ta_2O_5$ film (20 nm) | $<5.0 \times 10^{-4}$ | $1.0 \times 10^{-2}$ | — | — |
| Ex. 2 | PI substrate (25 μm) | $Ta_2O_5$ film (20 nm) | $AlSi_xO_y$ film (10 nm) | $Ta_2O_5$ film (20 nm) | $<5.0 \times 10^{-4}$ | $<5.0 \times 10^{-4}$ | — | — |
| Ex. 3 | PI substrate (25 μm) | $Ta_2O_5$ film (20 nm) | $Al_2O_3$ film (10 nm) | $Ta_2O_5$ film (300 nm) | — | — | $<5.0 \times 10^{-4}$ | $1.30 \times 10^{-3}$ |
| Comp. Ex. 1 | PI substrate (25 μm) | None | $Al_2O_3$ film (10 nm) | None | $4.1 \times 10^{-2}$ | 1.21 | — | — |
| Comp. Ex. 2 | PI substrate (25 μm) | $Ta_2O_5$ film (20 nm) | $Al_2O_3$ film (10 nm) | None | $<5.0 \times 10^{-4}$ | 1.17 | $<5.0 \times 10^{-4}$ | 0.58 |
| Comp. Ex. 3 | PI substrate (25 μm) | $Ta_2O_5$ film (20 nm) | $AlSi_xO_y$ film (10 nm) | None | $<5.0 \times 10^{-4}$ | 0.07 | — | — |
| Comp. Ex. 4 | PI substrate (25 μm) | None | None | None | 1.09 | — | — | — |

Example 1

<Preparation of Laminate>

The method of preparing the laminate of Example 1 (termed laminate 10-1 hereinafter, the reference sign is omitted in Table 1) will be described. A polyimide (PI) film UPILEX (trade name, manufactured by Ube Industries, Ltd.) with a thickness of 25 μm was prepared as a substrate 11 and placed in a vacuum chamber (substrate placing step).

Then, the substrate 11 was sputtered to form an undercoat layer 12 formed of a $Ta_2O_5$ film and having a thickness of 20 nm on the outer surface 11a thereof (undercoat layer forming step).

Specifically, a $Ta_2O_5$ film having a thickness of 20 nm was formed on the outer surface 11a of the substrate 11 placed in the vacuum chamber by reactive sputtering using a Ta target.

Then, the first to fourth steps were performed as follows. Through these steps, a functional layer 13 formed of an $Al_2O_3$ film (atomic layer deposition film 24) with a thickness of 10 nm was formed on an outer surface 12a of the undercoat layer 12 (functional layer forming step).

Specifically, first, TMA as a film-forming material (precursor) and $N_2$ and $O_2$ as purge gases were supplied simultaneously to the outer surface 12a of the laminate placed in the vacuum chamber and halfway of being produced, with the undercoat layer 12 being formed thereon (first step).

At this first step, the period of time of supplying TMA, $N_2$, and $O_2$ was 1 second. The temperature in the vacuum chamber was 90° C.

After that, $O_2$ and $N_2$ as purge gases were supplied into the vacuum chamber while the vacuum chamber was exhaust-ventilated, whereby the precursors 23 not coupled to the adsorption sites present in the outer surface 12a of the undercoat layer 12 were discharged from the vacuum chamber (second step).

At this second step, the period of time of supplying $O_2$ and $N_2$ was 10 seconds. The amount of $O_2$ and $N_2$ supplied was 100 sccm each. The temperature in the vacuum chamber was 90° C.

After that, the cycle of the first and second steps was repeated 15 times (third step).

After that, $O_2$ was supplied into the vacuum chamber as a reaction gas that also serves as a discharge gas for 10 seconds, and at the same time, plasma discharge was performed in an ICP mode. Thus, a voltage was applied to $O_2$ to generate plasma. The plasma was permitted to react with the precursors 23 to form an atomic layer deposition film 24 with a thickness of one atomic layer (fourth step).

The power source for plasma gas excitation used then was a 13.56 MHz power supply.

The thickness of the atomic layer deposition film 24 when the cycle of the first to fourth steps was performed once was 0.14 nm (1.4 Å). Based on this, performing the cycle of the first to fourth steps 73 times, an $Al_2O_3$ film (functional layer 13) with a thickness of 10 nm was formed. Thus, a structure 25 was formed.

Then, an overcoat layer 14 formed of a $Ta_2O_5$ film with a thickness of 20 nm was formed on the outer surface 13a of the functional layer 13 by sputtering (overcoat layer forming step).

Specifically, the outer surface 13a of the functional layer 13 of the structure 25 placed in the vacuum chamber was reactively sputtered using a Ta target to thereby form a $Ta_2O_5$ film with a thickness of 20 nm.

Thus, the laminate 10-1 of Example 1 as shown in Table 1 was produced.

Example 2

The laminate of Example 2 (termed laminate 10-2 hereinafter, the reference sign is omitted in Table 1) has the same configuration as the laminate 10-1 except that, as shown in Table 1, the material of the functional layer 13 has been replaced by $AlSi_xO_y$. The laminate 10-2 was produced similarly to the method of preparing the laminate 10-1 except for differences in the functional layer formation step.

Specifically, in the functional layer forming step, trimethylaluminum and trisdimethylaminosilane were alternately deposited as precursors 23 to form an AlSi$_x$O$_y$ film with a thickness of 10 nm as a functional layer 13.

Example 3

The laminate of Example 3 (termed laminate 10-3 hereinafter, the reference sign is omitted in Table 1) has the same configuration as the laminate 10-1 except that, as shown in Table 1, the thickness of the overcoat layer 14 is 300 nm. The laminate 10-3 was produced similarly to the method of preparing the laminate 10-1 except for differences in the amount of deposition of the overcoat layer formation step.

Example 4

A laminate (gas barrier film) was obtained in the same manner as in Example 1.

A first electrode layer, a light-emitting layer, and a second electrode layer were formed on the laminate (gas barrier film), followed by forming a sealing cap, thereby forming an organic light-emitting element 210 having the laminate structure shown in FIG. 6.

Example 5

A laminate (gas barrier film) was obtained in the same manner as in Example 2. Similarly to Example 4, a first electrode layer, a light-emitting layer, and a second electrode layer were formed on the laminate (gas barrier film), followed by forming a sealing cap, thereby forming an organic light-emitting element 210 having the laminate structure shown in FIG. 6.

Example 6

Referring to FIG. 8, description will be given of a method of producing a laminate of Example 6.

First, using a wire bar, a coating liquid was applied to the outer surface 311a of a substrate 311 formed of a polyethylene terephthalate (PET) film (A4100 (model number) manufactured by Toyobo Co., Ltd.) and having a thickness of 100 μm, thereby forming an adhesive layer (not shown) with a dry thickness of 0.1 μm.

The coating liquid was prepared in this case by dissolving an organic polymer that is a copolymer of poly (methacrylic acid-2-hydroxyethyl) and polymethacrylic acid methyl, wherein the ratio of poly (methacrylic acid-2-hydroxyethyl) was 35 mol %, in a mixture solution of methyl ethyl ketone and cyclohexanone.

Then, the substrate 311 having the adhesive layer formed thereon was placed in a vacuum chamber, and a SiO$_{1.6}$ film (having a composition of SiO$_{1.6}$) with a thickness of 30 nm was formed as a primer layer 312 on the outer surface (front surface) of the adhesive layer by electron beam vapor deposition. In this case, the pressure in the vacuum chamber prior to deposition was 2×10$^{-3}$ Pa, and that during deposition was 1×10$^{-2}$ Pa.

Then, an Al$_2$O$_3$ film with a thickness of 0.6 nm was formed as an atomic layer deposition film 313 by ALD on the outer surface 312a of the primer layer 312.

Specifically, the Al$_2$O$_3$ film with a thickness of 0.6 nm was formed through the following steps.

First, after setting the pressure in the deposition chamber (pressure prior to deposition) to 0.5 Pa, O$_2$ was supplied as a reaction and discharge gas to the outer surface 312a of the primer layer 312 which was placed in the deposition chamber (step 1).

Then, after plasma discharge, the interior of the deposition chamber was gas-purged (step 2). In the gas purging, O$_2$ and N$_2$ were supplied as purge gases for 10 seconds. The reaction temperature then was 90° C.

Then, trimethylaluminum (TMA) as a film-forming material (precursor), and N$_2$ as a purge gas were simultaneously supplied into the deposition chamber (step 3).

Then, N$_2$ as a purge gas was supplied into the deposition chamber (step 4).

O$_2$ was supplied as a reaction and discharge gas and plasma discharge was performed in an ICP mode in the deposition chamber (step 5), whereby one atomic layer of an Al$_2$O$_3$ film (part of the atomic layer deposition film 313) was formed on the outer surface 312a of the primer layer 312. The power supply for plasma gas excitation used was a 13.56 MHz power supply. The pressure in the deposition chamber was set to 40 Pa.

Then, N$_2$ as a purge gas was supplied into the deposition chamber (step 6).

A cycle of the above steps 3 to 6 was repeated to thereby form an Al$_2$O$_3$ film (atomic layer deposition film 313) with a thickness of 0.6 nm.

Thus, a laminate of Example 6 was produced.

Example 7

Referring to FIG. 8, description will be given of a method of producing a laminate of Example 7.

In Example 7, the laminate of Example 7 was produced similarly to the laminate of Example 6, except that the thickness of the atomic layer deposition film 313 constituting the laminate of Example 7 was changed to 10 nm.

Comparative Example 1

The laminate of Comparative Example 1 (termed laminate E-1 hereinafter, the reference sign is omitted in Table 1) has the same configuration as the laminate 10-1, except that, as shown in Table 1, the former included neither the undercoat layer 12 nor the overcoat layer 14. In the laminate E-1, a functional layer 13 was directly formed on the outer surface 11a of the substrate 11, and was on top.

Comparative Example 2

The laminate of Comparative Example 2 (termed as laminate E-2 hereinafter, the reference sign is omitted in Table 1) has a configuration similar to the laminate 10-1, except that, as shown in Table 1, the former includes no overcoat layer 14. The laminate E-2 was produced similarly to the method of preparing the laminate 10-1, except that the overcoat layer formation step was not performed.

Comparative Example 3

The laminate of Comparative Example 3 (termed laminate E-3 hereinafter, the reference sign omitted in Table 1) has a configuration similar to the laminate 10-2, except that, as shown in Table 1, the former includes no overcoat layer. The laminate E-3 was produced similarly to the method of preparing the laminate 10-2, except that the overcoat layer formation step was not performed.

Comparative Example 4

Comparative Example 4 is a PI substrate with a thickness of 25 μm prepared for use as a substrate 11 and for measuring the water vapor transmission rate of the substrates 11 used in Examples 1 to 3 and Comparative Examples 1 to 3. Accordingly, although Comparative Example 4 is not a laminate, it be termed laminate E-4 hereinafter (the reference sign is omitted in Table 1) for the sake of convenience.

Comparative Example 5

Similarly to Example 4, a first electrode layer, a light-emitting layer, and a second electrode layer were formed on the laminate of Comparative Example 1, followed by forming a sealing cap to thereby form an organic light-emitting element.

Comparative Example 6

Similarly to Example 4, a first electrode layer, a light-emitting layer, and a second electrode layer were formed on the laminate of Comparative Example 2, followed by forming a sealing cap to thereby form an organic light-emitting element.

Comparative Example 7

Similarly to Example 4, a first electrode layer, a light-emitting layer, and a second electrode layer were formed on the laminate of Comparative Example 3, followed by forming a sealing cap to thereby form an organic light-emitting element.

Comparative Example 8

In Comparative Example 8, at the step of forming the primer layer 312 (see FIG. 8) performed in Example 6, except that the pressure during deposition was changed to $9 \times 10^{-2}$ Pa.

Then, an $Al_2O_3$ film with a thickness of 0.6 nm was formed as an atomic layer deposition film 313 by a method similar to Example 6 (ALD), on the outer surface 312a of the primer layer 312.

Thus, the laminate of Comparative Example 8 was produced.

Comparative Example 9

In Comparative Example 9, at the step of forming the primer layer 312 (see FIG. 8) performed in Example 7, except that the pressure during deposition was changed to $9 \times 10^{-2}$ Pa.

Then, an $Al_2O_3$ film with a thickness of 10 nm was formed as an atomic layer deposition film 313 by a method similar to Example 7 (ALD), on the outer surface 312a of the primer layer 312.

Thus, the laminate of Comparative Example 9 was produced.

Comparative Example 10

In Comparative Example 10, $SiO_{1.6}$ with a thickness of 30 nm was formed as a primer layer 312 on the outer surface 311a of a substrate 311 made of a polyethylene terephthalate (PET) film (A4100 (model number) manufactured by Toyobo Co., Ltd) with a thickness of 100 μm, without performing the step of forming the atomic layer deposition film 313 (see FIG. 8) performed in Example 6 or 7.

Thus, the laminate of Comparative Example 10 was produced.

<Evaluation Method>

The laminates of Examples 1 to 4 and the laminates of Comparative Examples 1 to 3 were evaluated by performing durability tests and mechanical stress tests.

However, as shown in Table 1, the durability tests were conducted using the laminates of Examples 1 and 2 and the laminates of Comparative Examples 1 to 3. The mechanical stress tests were conducted using the laminate of Example 3 and the laminate of Comparative Example 2.

In each test, the water vapor transmission rates before and after the test were compared.

The water vapor transmission rate was measured using PERMATRAN (registered trademark), i.e., a water vapor transmission rate measuring device, manufactured by MOCON Inc., or AQUATRAN (registered trademark), i.e., a high sensitivity water vapor transmission rate measuring device, manufactured by MOCON Inc. However, AQUATRAN (registered trademark) was used when the measured value was below the lower measurement limit of PERMATRAN (registered trademark).

The lower measurement limit of PERMATRAN (registered trademark) was 0.02 (g/m²/day). The lower measurement limit of AQUATRAN (registered trademark) was $5.0 \times 10^{-4}$ (g/m²/day).

Water vapor transmission rates were all measured using $N_2$ gas adjusted to a temperature of 40° C. and a humidity of 90% RH.

When the laminate is used as a gas barrier film, the water vapor transmission rate is preferably, for example, 0.5 (g/m²/day) or less.

<Water Vapor Transmission Rate Before Test>

As shown in Table 1, the water vapor transmission rates of the laminates 10-1 to 10-3 of Examples 1 to 3 before the tests were all equal to or less than the lower measurement limit $5.0 \times 10^{-4}$ (g/m²/day) of AQUATRAN (registered trademark) (indicated as $<5.0 \times 10^{-4}$ in Table 1). The water vapor transmission rate of the laminate E-1 of Comparative Example 1 was $4.1 \times 10^{-4}$ (g/m²/day). The water vapor transmission rates of the laminates E-2 and E-3 of Comparative Examples 2 and 3 were $5.0 \times 0^{-4}$ (g/m²/day) or less.

The water vapor transmission rate of the substrate 11 commonly used in the individual laminates (laminate E-4 of Comparative Example 4) was 1.09 (g/m²/day).

<Durability Test>

In the durability tests, pure water was boiled, and the laminates 10-1, 10-2, and E-1 to E-3 were exposed to the generated water vapor for 5 minutes.

As shown in Table 1, in the water vapor transmission rate of the laminates after durability tests, the water vapor transmission rate of the laminate 10-1 was $1.0 \times 10^{-2}$ (g/m²/day). The water vapor transmission rate of the laminate 10-2 was $5.0 \times 10^{-4}$ (g/m²/day) or less. The water vapor transmission rate of the laminate E-1 was 1.21 (g/m²/day). The water vapor transmission rate of the laminate E-2 was 1.17 (g/m²/day). The water vapor transmission rate of the laminate E-3 was 0.07 (g/m²/day).

<Mechanical Stress Test>

The mechanical stress tests were conducted by bonding each of the laminates $10^{-3}$ and E-2 to a long film, and winding the film by one-turn around a 3-inch (7.62 cm) core. Winding of each laminate around such a core applied a mechanical stress, such as rubbing or pressing, to the laminate.

The water vapor transmission rate of the laminate 10-3 after the mechanical stress test was $1.30 \times 10^{-3}$ (g/m²/day). The water vapor transmission rate of the laminate E-2 was 0.58 (g/m²/day).

<Water Vapor Transmission Rate Measurements Before and After Durability Test>

For the laminates (gas barrier films) of Examples 4 and 5 and Comparative Examples 5 to 7, the water vapor transmission rate WVTR (g/m²/day) was measured before and after the durability tests. The water vapor transmission rate WVTR was measured using AQUATRAN (registered trademark), i.e., a high sensitivity water vapor transmission rate measuring device, manufactured by MOCON Inc. The water vapor transmission rate was measured under a $N_2$ gas atmosphere which was adjusted to a temperature of 40° C. and a humidity of 90% RH.

In the durability tests, the gas barrier films of Examples 4 and 5 and Comparative Examples 5 to 7 were placed in a PCT (pressure cooker test) acceleration tester for 24 hours. The temperature was 105° C. and the humidity was 100% RH in the accelerated life test machine.

Then, the water vapor transmission rate after the durability test was measured using AQUATRAN (registered trademark), i.e., a high sensitivity water vapor transmission rate measuring device, manufactured by MOCON Inc., or PERMATRAN (registered trademark), i.e., a water vapor transmission rate measuring device manufactured by MOCON Inc. The water vapor transmission rate was measured under a $N_2$ gas atmosphere which was adjusted to a temperature of 40° C. and a humidity of 90% RH.

As shown in Table 2, the water vapor transmission rates of the laminates of 10-4 and 10-5 of Examples 4 and 5 before the tests were all equal to or less than the lower measurement limit $5.0 \times 10^{-4}$ (g/m²/day) of AQUATRAN (registered trademark) (indicated as <$5.0 \times 10^{-4}$ in Table2). The water vapor transmission rate of the laminate E-5 of Comparative Example 5 was $4.1 \times 10^{-4}$ (g/m²/day). The water vapor transmission rates of the laminates E-6 and E-7 of Comparative Examples 6 and 7 were $5.0 \times 10^{-4}$ (g/m²/day) or less.

After the durability tests, the water vapor transmission rate of the laminate (gas barrier film) 10-4 of Example 4 was 0.45 (g/m²/day), the water vapor transmission rate of the laminate (gas barrier film) 10-5 of Example 5 was $5.0 \times 10^{-4}$ (g/m²/day) or less, the water vapor transmission rate of the laminate E-5 of Comparative Example 5 was 1.21 (g/m²/day), the water vapor transmission rate of the laminate E-6 of Comparative Example 6 was 1.17 (g/m²/day), and the water vapor transmission rate of the laminate E-7 of Comparative Example 7 was 0.07 (g/m²/day).

The results are shown in Table2.

<Light Emission Test of Organic Light-Emitting Elements>

The organic light-emitting elements prepared in Examples 4 and 5 and Comparative Examples 5 to 7 were exposed to an environment of 60° C. and 90% RH (environmental test). After the environmental test, a voltage of 10V was applied across the voltage application parts (not shown) of the first and second electrode layers of each element, and during the voltage application, the light emitting state of the element was observed. The light emitting area was measured with the microscope, and the ratio of the light emitting area to the evaluation area was calculated as the area ratio of the light emitting region.

Table 2 shows the measurements of the water vapor transmission rates before and after the durability tests, and the light emitting area ratios.

TABLE 2

| | Laminate structure | | | | Water vapor transmission rate WVTR of laminate [g/m²/day] | | Light emitting area ratio (light emitting area/ evaluation area) [%] |
|---|---|---|---|---|---|---|---|
| | Substrate | Undercoat layer | Functional layer (ALD film) | Overcoat layer | Before durability test | After durability test (after 24 hours PCT) | |
| Ex. 4 | PI substrate (25 μm) | Ta₂O₅ film (20 nm) | Al₂O₃ film (10 nm) | Ta₂O₅ film (20 nm) | <5.0 × 10⁻⁴ | 0.15 | 32 |
| Ex. 5 | PI substrate (25 μm) | Ta₂O₅ film (20 nm) | AlSixOy film (10 nm) | Ta₂O₅ film (20 nm) | <5.0 × 10⁻⁴ | <5.0 × 10⁻⁴ | 98 |
| Com. Ex. 5 | PI substrate (25 μm) | None | Al₂O₃ film (10 nm) | None | 4.1 × 10⁻² | 1.21 | 0 |
| Comp. Ex. 6 | PI substrate (25 μm) | Ta₂O₅ film (20 nm) | Al₂O₃ film (10 nm) | None | <5.0 × 10⁻⁴ | 1.17 | 18 |
| Comp. Ex. 7 | PI substrate (25 μm) | Ta₂O₅ film (20 nm) | AlSixOy film (10 nm) | None | <5.0 × 10⁻⁴ | 0.07 | 60 |

<Water Vapor Transmission Rate Measurements of Laminates of Examples 6 and 7>

To evaluate the water vapor barrier properties of the laminates of Examples 6 and 7, the water vapor transmission rates (WVTR) of the laminates of Examples 6 and 7 were measured in an atmosphere of 40° C. and 90% RH using a water vapor transmittance measuring device (MOCON AQUATRAN (registered trademark) manufactured by MOCON, Inc.).

<Water Vapor Transmission Rate Measurement of Laminates of Comparative Examples 8 to 10>

Then, to evaluate the water vapor barrier properties of the laminates of Comparative Examples 8 to 10, the water vapor transmission rates (WVTR) of the laminates of Comparative Examples 8 to 10 were measured in an atmosphere of 40° C. and 90% RH using a water vapor transmittance measuring device (MOCON Permatran (registered trademark) manufactured by MOCON, Inc.).

<Evaluation of Pores in Primer Layer>

The diameters of pores in the primer layer 312 were evaluated by way of an evaluation of a maximum pore diameter therein using a pulse beam type positron annihilation lifetime spectroscopy device (PALS-1 (trade name) manufactured by Fuji Imvac Inc.). The maximum pore diameter in the primer layer 312 corresponds to the pore diameter that is the largest among the diameters of the pores whose existence probability is 0.0001 or more in the pore diameter measurement using a pulse beam type positron annihilation lifetime spectroscopy device, when the existence probability of all the pores having a diameter of 10 nm or less is taken to be 1.

The diameters of pores in the primer layer 312 were evaluated using a sample in which only the primer layer 312 was formed on the outer surface 311a of a substrate 311 which was made of a polyethylene terephthalate (PET) film (A4100 (model number) with a thickness of 100 μm manufactured by Toyobo Co., Ltd), without performing the step of forming the atomic layer deposition film 313 (see FIG. 8) performed in Examples 6 and 7 or Comparative Examples 8 and 9. The results are shown in Table 3.

As shown in Table 1, comparing the laminate 10-3 of Example 3 with the laminate E-2 of Comparative Example 2, the water vapor transmission rate after the mechanical stress test is very low in the laminate 10-3, whereas it is very high in the laminate E-2, reflecting presence/absence of the overcoat layer 14. Thus, it will be understood that the presence of the overcoat layer improves durability associated with gas barrier properties in the mechanical stress test. This is considered to be because the functional layer 13 is covered with the overcoat layer 14 for protection of the functional layer 13 from external forces due to mechanical stress, and degradation of the functional layer 13 is reduced accordingly.

Referring to Table 2, it was confirmed that Examples 4 and 5 secured a low water vapor transmission rate (i.e., high gas barrier properties), protected the functional layer 223 in the durability test, and somewhat prevented the $Al_2O_3$ film, which was not chemically stable against water vapor, from being deteriorated, due to sequential formation of: an undercoat layer 222 on the outer surface 221a of a substrate 221, the undercoat layer having adsorption sites to be coupled to the precursors 232 as film-forming materials of the atomic

TABLE 3

| | Primer layer 312 | | | Atomic layer deposition film 313 | | Water vapor transmission rate of laminate [g/(m² day)] |
|---|---|---|---|---|---|---|
| | Composition | Film thickness [nm] | Maximum pore diameter [nm] | Composition | Film thickness [nm] | |
| Ex. 6 | $SiO_{1.6}$ | 30 | 0.9 | $Al_2O_3$ | 0.6 | $1.0 \times 10^{-2}$ |
| Ex. 7 | $SiO_{1.6}$ | 30 | 0.9 | $Al_2O_3$ | 10 | $2.0 \times 10^{-3}$ |
| Comp. Ex. 8 | $SiO_{1.6}$ | 30 | 2.8 | $Al_2O_3$ | 0.6 | $5.4 \times 10^{0}$ |
| Comp. Ex. 9 | $SiO_{1.6}$ | 30 | 2.8 | $Al_2O_3$ | 10 | $7 \times 10^{-2}$ |
| Comp. Ex. 10 | $SiO_{1.6}$ | 30 | 0.9 | None | | $1.0 \times 10^{0}$ |

<Evaluations>

As shown in Table 1, the water vapor transmission rate of the laminate 10-1 of Example 1 after the durability test was about ⅛ of the water vapor transmission rate of the laminate E-2 of Comparative Example 2 having no overcoat layer 14, and that of the laminate E-1 of Comparative Example 1 having neither the overcoat layer 14 nor the undercoat layer 12.

It will be understood that even after the durability test, the laminate 10-1 has much higher gas barrier properties than the laminates E-1 and E-2, proving that its durability is high.

The low gas barrier properties of the laminates E-1 and E-2 reside in that, in the absence of the overcoat layer 14, the $Al_2O_3$ film reacts with moisture and deteriorates.

Before the durability test as well, the water vapor transmission rate of the laminate E-1 is very low as compared with the laminate 10-1. This is considered to be because the density of the $Al_2O_3$ film is low in the laminate E-1 in the absence of the undercoat layer 12.

As shown in Table 1, the laminate 10-2 of Example 2 retained a better water vapor transmission rate after the durability test as compared with the laminate 10-1.

This is considered to be because the $AlSi_xO_y$ film has a higher resistance to moisture than the $Al_2O_3$ film, in terms of the fact that the water vapor transmission rate of the laminate E-3 after the durability test is about 45% of that of the laminate E-1 after the durability test.

layer deposition film; a functional layer 223 produced through chemical adsorption of the precursors 232 to the adsorption sites on the outer surface 222a of the undercoat layer 222; and an overcoat layer 224 on the outer surface 223a of the functional layer 223.

On the other hand, Comparative Example 5, in which the functional layer was directly formed on the outer surface of the film substrate, hardly exhibited gas barrier properties even before the durability test (i.e., exhibited only moderate gas barrier properties with 10 nm thickness). It was also confirmed that, in the absence of the overcoat layer, the functional layer deteriorated after the durability test and low water vapor transmission rate (i.e., high gas barrier properties) was not secured.

In Comparative Example 6, the outer surface of the film substrate was sequentially provided thereon with: an undercoat layer having adsorption sites capable of being coupled to the precursors as film-forming materials of the atomic layer deposition film; and a functional layer obtained through chemical adsorption of the precursors to the adsorption sites on the outer surface of the undercoat layer. Therefore, the water vapor transmission rate was confirmed to be at a low level (i.e., high gas barrier properties were confirmed) before the durability test. However, it was also confirmed that, in the absence of the overcoat layer, the functional layer deteriorated after the durability test and low water vapor transmission rate (i.e., high gas barrier properties) was not secured.

In Comparative Example 7, the outer surface of the film substrate was provided thereon with: an undercoat layer having adsorption sites capable of being coupled to the precursors as film-forming materials of the atomic layer deposition film; and a functional layer obtained through chemical adsorption of the precursors to the adsorption sites on the outer surface of the undercoat layer. Therefore, the water vapor transmission rate was confirmed to be at a low level (i.e., high gas barrier properties were confirmed) before the durability test. However, it was also confirmed that, in the absence of the overcoat layer, the water vapor transmission rate increased after the durability test, the functional layer deteriorated after the durability test, and low water vapor transmission rate (i.e., high gas barrier properties) was not secured.

Referring to Table 2, the gas barrier film of Example 4 used an $Al_2O_3$ film, which was not chemically stable to water vapor, for the functional layer 223. However, it was confirmed that the presence of the undercoat layer 222 and the overcoat layer 224 somewhat contributed to suppressing rapid deterioration in the water vapor resistance, and somewhat suppressing decrease in the light-emitting area ratio of the element after the environmental test, i.e., deterioration in the performance of the organic light-emitting element.

Further, it was confirmed that the gas barrier film of Example 5, which maintained high gas barrier performance even after the durability test, barely lowered the light-emitting area ratio of the element after the environmental test, that is, barely deteriorated the performance of the organic light-emitting element.

On the other hand, it was confirmed that the gas barrier film of Comparative Example 5, whose gas barrier performance deteriorated substantially to the level of a single PI film after the durability test, disabled the element from emitting light after the environmental test, losing protection performance for the organic light-emitting element.

Further, it was confirmed that the gas barrier film of Comparative Example 6, whose gas barrier performance deteriorated substantially to the level of a single PI film after the durability test, significantly lowered the light-emitting area ratio of the element after the environmental test and barely exhibited the performance of protecting the organic light-emitting element. The reason why the light-emitting area ratio was high as compared with Comparative Example 5 is that the (initial) gas barrier performance before the durability test was high.

Further, it was confirmed that the gas barrier film of Comparative Example 7, which did not maintain high gas barrier performance after the durability test, lowered the light-emitting area ratio of the element after the environmental test, and lost protection performance for the organic light-emitting element.

It should be noted that the evaluation of Comparative Example 7 is better than that of Example 4. This is because the chemical stability of the $AlSi_xO_y$ film for water vapor was significantly higher than that of the $Al_2O_3$ film. However, from the comparisons between Example 4 and Comparative Example 6, and between Example 5 and Comparative Example 7, it is apparent that, where the compositions of the functional layers 223 are the same therebetween, provision of the overcoat layer 224 contributes to improving barrier properties and durability.

As can be seen from the results of Examples 4 and 5, the gas barrier film 220 of the present invention enables stable deposition of the functional layer 223 by providing a surface for forming the atomic layer deposition film 223 on the outer surface 222a of the undercoat layer 222 containing an inorganic material, and secures the water vapor transmission rate at a low level with a small thickness.

Furthermore, formation of the overcoat layer 224 on the outer surface 223a of the functional layer 223 can protect the functional layer 223, prevent the functional layer 223 from being deteriorated due to the durability test such as exposure to water vapor, and improve durability thereof. Also, an organic light-emitting element formed using the gas barrier film can suppress lowering of the light-emitting area ratio due to exposure in the environmental test, that is, suppress the increase of the dark spots. Thus, the performance of the organic light-emitting element and that of an electronic device including this element are improved.

Accordingly, it was confirmed that gas barrier properties and durability of the gas barrier film 220 were improved as compared with the conventional configurations, and that the performance of the organic light-emitting element was improved and long-term quality of an electronic device including this element was ensured.

<Evaluation of Water Vapor Transmission Rate of Laminates of Example 6 and Comparative Example 8>

Referring to Table 3, it was confirmed that the laminate of Example 6 whose water vapor transmission rate was $1.0 \times 10^{-2}$ g/(m² day) exhibited good water vapor barrier properties of $1.0 \times 10^{-2}$ g/(m² day) or less even when including the $Al_2O_3$ layer (atomic layer deposition film 313) with an extremely small thickness of 0.6 nm.

On the other hand, it was confirmed that the laminate of Comparative Example 8, whose water vapor transmission rate was $5.4 \times 10^0$ g/(m² day), exhibited poor water vapor barrier properties.

<Evaluation of Water Vapor Transmission Rate of Laminates of Example 7 and Comparative Example 9>

Referring to Table 3, it was confirmed that the laminate of Example 7 whose water vapor transmission rate was $2.0 \times 10^{-3}$ g/(m² day) exhibited good water vapor barrier properties of $1.0 \times 10^{-2}$ g/(m² day) or less.

On the other hand, it was confirmed that the laminate of Comparative Example 9, whose water vapor transmission rate was $7 \times 10^{-2}$ g/(m² day), exhibited poor water vapor barrier properties.

<Evaluation of Water Vapor Transmission Rate of Laminates of Comparative Example 10>

Referring to Table 3, the laminate of Comparative Example 10, which included no atomic layer deposition film 313, exhibited a water vapor transmission rate of $1.0 \times 10^0$ g/(m² day) but did not exhibit good water barrier properties corresponding to a water vapor transmission rate of $1.0 \times 10^{-2}$ g/(m² day) or less, although it would have been imparted with water vapor barrier properties by the primer layer 312.

<Pore Diameter Evaluation>

Referring to Table 3, in the primer layers 312 of the laminates of Examples 6 and 7 which were confirmed to have good water vapor barrier properties, the maximum pore diameter was 0.9 nm. On the other hand, in the primer layers 312 of the laminates of Comparative Examples 8 and 9 which were confirmed not to have good water vapor barrier properties, the maximum pore diameter was 2.8 nm.

As described above, according to the laminate of the present invention, when the primer layer 312 is formed using an inorganic material including pores with a maximum diameter of 1.0 nm or less, the water vapor transmission rate decreases greatly and a laminate having high water vapor barrier properties can be obtained, as compared with the case where the primer layer 312 is formed of an inorganic material including pores with a maximum diameter 1.0 nm or more.

Some preferred embodiments of the present invention have been described so far by way of examples, but the present invention is not limited to these embodiments and examples. One or more constituents may be added, removed, or substituted, or other changes may be made without departing from the spirit of the present invention.

Further, the present invention should not be limited by the foregoing description, but should be limited only by the appended claims.

INDUSTRIAL APPLICABILITY

The laminate and the method of producing the same, and the gas barrier film and the method of producing the same of the present invention are applicable, for example, to electronic components such as electroluminescent elements (EL elements), liquid crystal displays, and semiconductor wafers, films for packaging drugs and foods, and films for packaging precision components.

In addition, the present invention is applicable to methods of producing a gas barrier film including a substrate made of a high-molecular-weight material, and organic light-emitting elements including the gas barrier film.

The present invention is also applicable to laminates including a substrate made of an organic polymer, a primer layer provided on the outer surface of the substrate, and an atomic layer deposition film provided on the outer surface of the primer layer, and methods of producing such laminates, and is applicable to gas barrier films, and methods of producing such barrier films. The laminate of the present invention may be used for electronic components such as electroluminescenct elements (EL elements), liquid crystal displays, semiconductor wafers, and the like.

REFERENCE SIGNS LIST 10, 310 . . . Laminate (gas barrier film); 11, 311 . . . Substrate; 11a, 12a, 13a, 221a, 222a, 223a, 224a, 311a, 312a . . . Outer surface; 12, 222 . . . Undercoat layer (inorganic layer); 13, 223 . . . Functional layer; 14, 224 . . . Overcoat layer (inorganic layer); 21 . . . Void; 23, 232 . . . Precursor; 24, 225, 313 . . . Atomic layer deposition film; 25 . . . Structure; 210 . . . Organic light-emitting element; 221 . . . Film substrate; 213 . . . First electrode layer; 214 . . . Light-emitting layer; 215 . . . Second electrode layer; 216 . . . Sealing cap; 312 . . . Primer layer (undercoat layer).

What is claimed is:

1. A laminate comprising:
an organic polymer substrate having a first surface;
an undercoat layer consisting of tantalum oxide located on at least part of the first surface of the substrate;
an atomic layer deposition functional layer covering an outer surface of the undercoat layer; and
an overcoat layer consisting of tantalum oxide located covering an outer surface of the functional layer, wherein a thickness of the overcoat layer in from 20 nm to 300 nm and a thickness of the undercoat layer is from 20 nm to 200 nm.

2. The laminate of claim 1, wherein the functional layer has a thickness in a range of 0.5 nm or more to 200 nm or less.

3. A gas barrier film comprising the laminate of claim 1, wherein the laminate has a water vapor transmission rate of 0.5 g/($m^2$ day) or less.

4. The laminate of claim 1, wherein the functional layer consists of $Al_2O_3$.

5. The laminate of claim 1, wherein the functional layer consists of a mixture of SiOx ($1 \leq x \leq 2$) and AlOx (where $1 \leq x \leq 1.5$).

6. A method of producing a laminate, comprising:
placing an organic polymer substrate made material in a vacuum chamber;
forming an undercoat layer consisting of tantalum oxide on at least part of an outer surface of the substrate;
adsorbing atomic layer deposition precursors on an outer surface of the undercoat layer and forming an atomic layer deposition functional layer from the precursors by atomic layer deposition to cover the outer surface of the undercoat layer, the functional layer containing a second inorganic substance coupled to the adsorption sites; and
forming an overcoat layer consisting of tantalum oxide to cover an outer surface of the functional layer, wherein a thickness of the overcoat layer in from 20 nm to 300 nm and a thickness of the undercoat layer is from 20 nm to 200 nm.

7. The method of claim 6, wherein the functional layer consists of a mixture of SiOx ($1 \leq x \leq 2$) and AlOx (where $1 \leq x \leq 1.5$).

8. An organic light-emitting element comprising the laminate of claim 1, a first electrode layer, a light-emitting layer, and a second electrode layer.

9. The organic light-emitting element of claim 8, wherein the laminate has a water vapor transmission rate of 0.01 g/($m^2$ day) or less.

10. The method of claim 6, wherein the functional layer consists of $Al_2O_3$.

11. The method of producing a laminate of claim 10, comprising:
a first step of supplying the precursors to the vacuum chamber;
a second step, following the first step, of discharging a portion of the precursors not coupled to the outer surface of the undercoat layer, from the vacuum chamber;
a third step of repeating the first step and the second step a predetermined number of times;
a fourth step, following the third step, of supplying a reaction gas into the vacuum chamber and applying a voltage to the reaction gas to generate plasma for reaction of the plasma with the precursor so that an atomic layer deposition film with a thickness of one atomic layer is formed; and
performing, following the fourth step, a cycle of the first to fourth steps 15 times or more so that the laminated atomic layer deposition film has a total thickness corresponding to a thickness predetermined for the functional layer.

12. The method of producing a laminate of claim 6, wherein the undercoat layer and the overcoat layer are formed by chemical vapor deposition or physical vapor deposition.

13. The method of producing a laminate of claim 6, wherein the functional layer is so formed as to have a thickness in a range of 1 nm or more to 200 nm or less.

14. A method of producing a gas barrier film, comprising forming the laminate through the method of producing a laminate of claim 6 so as to have a water vapor transmission rate of 0.5 g/($m^2$ day) or less.

* * * * *